US010197391B2

(12) United States Patent
Thornberry et al.

(10) Patent No.: US 10,197,391 B2
(45) Date of Patent: ***Feb. 5, 2019

(54) SYSTEM AND PROCESS FOR ROOF MEASUREMENT USING IMAGERY

(71) Applicant: Pictometry International Corp., Rochester, NY (US)

(72) Inventors: Dale R. Thornberry, Carmel, IN (US); Chris T. Thornberry, Indianapolis, IN (US); Mark F. Garringer, Eaton, IN (US)

(73) Assignee: Pictometry International Corp., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/943,337

(22) Filed: Apr. 2, 2018

(65) Prior Publication Data

US 2018/0224271 A1    Aug. 9, 2018

Related U.S. Application Data

(63) Continuation of application No. 15/005,977, filed on Jan. 25, 2016, now Pat. No. 9,933,254, which is a (Continued)

(51) Int. Cl.
*G06K 9/00* (2006.01)
*G01B 11/28* (2006.01)
(Continued)

(52) U.S. Cl.
CPC .......... *G01B 11/28* (2013.01); *G06F 3/04815* (2013.01); *G06F 17/5004* (2013.01);
(Continued)

(58) Field of Classification Search
None
See application file for complete search history.

(56) References Cited

U.S. PATENT DOCUMENTS

| 4,497,551 A | 2/1985 | Lapeyre |
| 5,319,541 A | 6/1994 | Blanchard et al. |

(Continued)

FOREIGN PATENT DOCUMENTS

| AU | 2008230031 | 11/2009 |
| AU | 2010219392 | 9/2010 |
| WO | WO20000029806 | 5/2000 |

OTHER PUBLICATIONS

USPTO, Office Action regarding U.S. Appl. No. 13/915,285, dated Apr. 9, 2015.

(Continued)

*Primary Examiner* — Atiba O Fitzpatrick
(74) *Attorney, Agent, or Firm* — Dunlap Codding, P.C.

(57) ABSTRACT

The present disclosure describes systems and processes, including processes in which first location data is received. Visual access to a first image corresponding to the first location data is provided, the first image including a roof structure of a building. A first computer input capable of signaling a designation from the user of a building roof structure location within the first image is provided. A designation of the building roof structure location within the first image is received. Responsive to receiving the designation of the building roof structure location, a second computer input capable of signaling user-acceptance of the building roof structure location within the first image is provided. Responsive to receiving the user-acceptance confirming the designation of the building roof structure location, visual access to one or more second images corresponding to geographic location coordinates of the building roof structure location is provided.

19 Claims, 21 Drawing Sheets

Related U.S. Application Data continuation of application No. 14/018,943, filed on Sep. 5, 2013, now Pat. No. 9,244,589, which is a continuation of application No. 13/774,478, filed on Feb. 22, 2013, now Pat. No. 8,542,880, which is a continuation of application No. 12/470,984, filed on May 22, 2009, now Pat. No. 8,401,222, application No. 15/943,337, which is a continuation of application No. 13/786,699, filed on Mar. 6, 2013, now Pat. No. 9,329,749, which is a continuation of application No. 12/470,984, filed on May 22, 2009, now Pat. No. 8,401,222.

(51) Int. Cl.
*G06F 17/50* (2006.01)
*G06F 3/0481* (2013.01)
*G06T 7/62* (2017.01)

(52) U.S. Cl.
CPC ............ *G06K 9/00637* (2013.01); *G06T 7/62* (2017.01); *G06T 2207/10032* (2013.01)

(56) References Cited

U.S. PATENT DOCUMENTS

| | | | |
|---|---|---|---|
| 5,625,827 A | 4/1997 | Krause et al. |
| 5,633,995 A | 5/1997 | McClain |
| 5,699,444 A | 12/1997 | Palm |
| 5,995,765 A | 11/1999 | Kaneko et al. |
| 6,323,885 B1 | 11/2001 | Wiese |
| 6,385,541 B1 | 5/2002 | Blumberg et al. |
| 6,396,491 B2 | 5/2002 | Watanabe et al. |
| 6,446,053 B1 | 9/2002 | Elliott |
| 6,496,184 B1 | 12/2002 | Freeman et al. |
| 6,636,803 B1 | 10/2003 | Hartz, Jr. et al. |
| 6,766,282 B1 | 7/2004 | Schettine |
| 6,798,925 B1 | 9/2004 | Wagman |
| 6,836,270 B2 | 12/2004 | Du |
| 6,859,768 B1 | 2/2005 | Wakelam et al. |
| 6,980,690 B1 | 12/2005 | Taylor et al. |
| 7,003,400 B2 | 2/2006 | Bryant |
| 7,006,977 B1 | 2/2006 | Attra et al. |
| 7,046,839 B1 | 5/2006 | Richer et al. |
| 7,085,400 B1 | 8/2006 | Holsing et al. |
| 7,133,570 B1 | 11/2006 | Schreier et al. |
| 7,164,883 B2 | 1/2007 | Rappaport et al. |
| 7,239,761 B2 | 7/2007 | Weilenmann |
| 7,305,983 B1 | 12/2007 | Meder et al. |
| 7,324,666 B2 | 1/2008 | Zoken et al. |
| 7,343,268 B2 | 3/2008 | Kishikawa |
| 7,920,963 B2 | 4/2011 | Jouline et al. |
| 2002/0154174 A1 | 10/2002 | Redlich et al. |
| 2005/0033716 A1 | 2/2005 | Ambroz et al. |
| 2005/0038636 A1 | 2/2005 | Wakelam et al. |
| 2005/0288959 A1 | 12/2005 | Eraker et al. |
| 2006/0200311 A1 | 9/2006 | Arutunian et al. |
| 2006/0282235 A1 | 12/2006 | Thomas et al. |
| 2007/0106523 A1 | 5/2007 | Eaton et al. |
| 2007/0220174 A1 | 9/2007 | Abhyanker |
| 2008/0105045 A1 | 5/2008 | Woro |
| 2008/0221843 A1 | 9/2008 | Shenkar et al. |
| 2008/0262789 A1 | 10/2008 | Pershing et al. |
| 2009/0132436 A1 | 5/2009 | Pershing et al. |
| 2009/0141020 A1 | 6/2009 | Freund et al. |
| 2010/0110074 A1 | 5/2010 | Pershing |
| 2010/0114537 A1 | 5/2010 | Pershing |
| 2010/0179787 A2 | 7/2010 | Pershing et al. |
| 2014/0025343 A1 | 1/2014 | Gregg et al. |

OTHER PUBLICATIONS

Applicant, Response to Office Action regarding U.S. Appl. No. 13/915,285, dated Oct. 9, 2015.

USPTO, Office Action regarding U.S. Appl. No. 13/915,285, dated Dec. 16, 2015.

Xactware Solutions, Inc., Petition for inter partes review of U.S. Pat. No. 8,542,880, IPR2016-00594, Mail Date Feb. 8, 2016.

Pictometry International Corp., Electronic Field Study User Guide Version 2.7 (as filed as Exhibit-1004 in IPR2016-00594), Jul. 2007.

Hsieh, Yuan, Design and Evaluation of a Semi-Automated Site Modeling System (as filed as Exhibit-1005 in IPR2016-00594), Nov. 1995.

Schuch, Harold, Declaration in support of Petition for inter partes review of U.S. Pat. No. 8,542,880, IPR2016-00594 (as filed as Exhibit-1006 in IPR2016-00594), Mail Date Feb. 8, 2016.

Eagle View Technologies, Inc., and Pictometry International Corp; Complaint for infringement of U.S. Pat. No. 8,542,880 in litigation (*Eagle View Technologies, Inc.*, and *Pictometry International Corp. v. Xactware Solutions, Inc.*, and *Verisk Analytics, Inc.*) in the United States District Court District on New Jersey, case No. njd-1-15-cv-07025-RBK-JS, filing date Sep. 23, 2015.

Xactware Solutions, Inc., and Verisk Analytics, Inc., Answer to Complaint for infringement of U.S. Pat. No. 8,542,880 in litigation (*Eagle View Technologies, Inc.*, and *Pictometry International Corp. v. Xactware Solutions, Inc.*, and *Verisk Analytics, Inc.*) in the United States District Court District of New Jersey, case No. njd-1-15-cv-07025-RBK-JS, filing date Nov. 12, 2015.

Eagle View Technologies, Inc., and Pictometry International Corp; Amended Complaint for infringement of U.S. Pat. No. 8,542,880 in litigation (*Eagle View Technologies, Inc.*, and *Pictometry International Corp. v. Xactware Solutions, Inc.*, and *Verisk Analytics, Inc.*) in the United States District Court District of New Jersey, case No. njd-1-15-cv-07025-RBK-JS, filed Nov. 30, 2015.

Xactware Solutions, Inc., and Verisk Analytics, Inc., Amended Answer, Affirmative Defenses, Counterclaims to Amended Complaint for infringement of U.S. Pat. No. 8,542,880 in litigation (*Eagle View Technologies, Inc.*, and *Pictometry International Corp. v. Xactware Solutions, Inc.*, and *Verisk Analytics, Inc.*) in the United States District Court District of New Jersey, case No. njd-1-15-cv-07025-RBK-JS, filing date Dec. 14, 2015.

Xactware Solutions, Inc., and Verisk Analytics, Inc., Motion to Dismiss Complaint for infringement of U.S. Pat. No. 8,542,880 under 35 U.S.C. 101 and supporting Memorandum in litigation (*Eagle View Technologies, Inc.*, and *Pictometry International Corp. v. Xactware Solutions, Inc.*, and *Verisk Analytics, Inc.*) in the United States District Court District of New Jersey, case No. njd-1-15-cv-07025-RBK-JS, filing date Feb. 9, 2016.

Xactware Solutions, Inc., and Verisk Analytics, Inc., Invalidity Contentions regarding U.S. Pat. No. 8,542,880 in litigation (*Eagle View Technologies, Inc.*, and *Pictometry International Corp. v. Xactware Solutions, Inc.*, and *Verisk Analytics, Inc.*) in the United States District Court District of New Jersey, case No. njd-1-15-cv-07025-RBK-JS, filing date Feb. 9, 2016.

Eagle View Technologies, Inc., and Pictometry International Corp., Response with Claim Charts to Invalidity Contentions regarding U.S. Pat. No. 8,542,880 in litigation (*Eagle View Technologies, Inc.*, and *Pictometry International Corp. v. Xactware Solutions, Inc.*, and *Verisk Analytics, Inc.*) in the United States District Court District of New Jersey, case No. njd-1-15-cv-07025-RBK-JS, dated Mar. 10, 2016.

Eagles View Technologies, Inc., and Pictometry International Corp., Response in Opposition to Motion to Dismiss Complaint for infringement of U.S. Pat. No. 8,542,880 under 35 U.S.C. 101 (*Eagles View Technologies, Inc.*, and *Pictometry International Corp. v. Xactware Solutions, Inc.*, and *Verisk Analytics, Inc.*) in the United States District Court District of New Jersey, case No. njd-1-15-cv-07025-RBK-JS, filing date Mar. 22, 2016.

Pictometry International Corp., Patent Owner's Preliminary Response to petition for inter partes review of U.S. Pat. No. 8,542,880, IPR2016-00594, Filed Jun. 2, 2016.

Patent Trial and Appeal Board, Decision to institute inter partes review of claims 1-10 and 13-20 of U.S. Pat. No. 8,542,880, IPR2016-00594, Paper 13, Mail Date Aug. 31, 2016.

Pictometry International Corp., Patent Owner Response filed in IPR2016-00594, Nov. 16, 2016.

(56) References Cited

OTHER PUBLICATIONS

Bajaj, Declaration of Dr. Chandrajit Bajaj, as filed as Exhibit-2006 in IPR2016-00594 on Nov. 16, 2016.
Deposition of Mr. Harold Schuch of Nov. 2, 2016, as filed as Exhibit-2005 in IPR2016-00594 on Nov. 16, 2016.
Carr et al., Cohasset Town Report, 2008, as filed as Exhibit-2010 in IPR2016-00594 on Nov. 16, 2016.
Anonymous, LARIAC1 Pictometry Training webpage printout, dated 2009, as filed as Exhibit-2011 in IPR2016-00594 on Nov. 16, 2016.
Los Angeles County et al., LAR-IAC2 Product Guide, dated Feb. 2009, as filed as Exhibit-2012 in IPR2016-00594 on Nov. 16, 2016.
Anonymous; Los Angeles County Extends its License Agreement with Pictometry for New Oblique Aerial Photos; dated Mar. 7, 2006; as filed as Exhibit-2013 in IPR2016-00594 on Nov. 16, 2016.
Horan; Pictometry Administrative Training; as filed as Exhibit-2014 in IPR2016-00594 on Nov. 16, 2016.
Unknown; Screenshot of File Info sheet entitled "Information about TXWILMAdministrative Training"; as filed as Exhibit-2015 in IPR2016-00594 on Nov. 16, 2016.
Unknown; Description of Pictometry Training; as filed as Exhibit-2016 in IPR2016-00594 on Nov. 16, 2016.
Apgar; GIS Working Group Meeting Minutes 2007; as filed as Exhibit-2019 in IPR2016-00594 on Nov. 16, 2016.
Asimonye; Geospatial Information Systems Council—Pictometry: Oblique Imagery training, dated Apr. 2009; as filed as Exhibit-2020 in IPR2016-00594 on Nov. 16, 2016.
Unknown; Pictometry License Guidelines; dated Jan. 26, 2005; as filed as Exhibit-2021 in IPR2016-00594 on Nov. 16, 2016.
Unknown; Pictometry presentation dated Apr. 19, 2007; as filed as Exhibit-2022 in IPR2016-00594 on Nov. 16, 2016.
Lanctot; Welcome to Your End User Training; as filed as Exhibit-2023 in IPR2016-00594 on Nov. 16, 2016.
Pictometry International Corp.; Electronic Field Study Getting Started Guide; dated Jul. 2007; as filed as Exhibit-2024 in IPR2016-00594 on Nov. 16, 2016.
Gisuser; Pictometry Announces Technical Advancements for GIS Professionals; dated Dec. 5, 2006; Spatial Media; as filed as Exhibit-2025 in IPR2016-00594 on Nov. 16, 2016.
Unknown; Pictometry Announces Technical Advancements for GIS Professionals; dated Dec. 7, 2006; Directions Media; as filed as Exhibit-2026 in IPR2016-00594 on Nov. 16, 2016.
Bitter et al.; Macmillan Encyclopedia of Computers; Macmillan Publishing Company; 1992; vol. 1; pp. 230-231; as filed as Exhibit-2027 in IPR2016-00594 on Nov. 16, 2016.
Pictometry International Corp. et al.; Metropolitan Area Planning Council License Agreement; 2009; as filed as Exhibit-2009 in IPR2016-00594 on Nov. 16, 2016.
Patent Trial and Appeal Board, Final Written Decision in inter partes review of claims 1-10 and 13-20 of U.S. Pat. No. 8,542,880, IPR2016-00594, Paper 46, Aug. 24, 2017.
Xactware Solutions, Inc., Petitioner's Reply to Patent Owner Response in inter partes review of claims 1-10 and 13-20 of U.S. Pat. No. 8,542,880, IPR2016-00594, Paper 33, Jan. 27, 2017.
USPTO, Office Action regarding U.S. Appl. No. 13/915,285, dated Apr. 10, 2017.
Olof Henricsson, The Role of Color Attributes and Similarity Grouping in 3-D Building Reconstruction, Institute of Photogrammetry and Geodesy, Zurich, Switzerland.
CC-Modeler: a topology generator for 3-D city models, abstract, May 15, 1998.
Armin Gruen and Hinhua Wang; CC-Modeler: A Topology Generator for 3-D City Models, Inst. of Geodesy and Photogrammetry, Zurich, Switzerland.
Microsoft's MSN Virtual Earth: The Map is the Search Platform; Feb. 6, 2009.
Eagle View Technologies; Eagle View Measurements Premium Report; Oct. 22, 2008.
"Automatic House Reconstruction", http://www.vision.ee.ethz.ch/projects/Amobe_l/recons.html, accessed Mar. 15, 2010.

"PhotoModeler-Measure and Model Real-World Objects From Photographs", http://www.photomodeler.com/products/photomodeler.htm, accessed on Mar. 15, 2010.
Baillard C. et al., "Automatic Reconstruction of Piecewise Planar Models From Multiple Views", Dept. of Engineering Science, University of Oxford.
Chevrier C., et al., "Interactive 3D Reconstruction for Urban Areas: An Image Based Tool", CAAD Futures 2001.pp. 1-13.
Debevec, Paul E. et al., "Modeling and Rendering Architecture From Photographs: A Hybrid Geometry-And-Image Based Approach", University of California at Berkeley, 1996.
"Pictometry Announces Software and Web-based Solution for Engineers, Architects, and Planners", Press Release dated Jan. 22, 2004, Rochester, NY.
Automated Systems Research, http://www.asrsoft.com/about.html, accessed May 22, 2009.
Claim Rep Measure Roof, http://www.claimrep.com/roofSize.htm, accessed on May 22, 2009.
GeoSpan Aerial Imagery, http://www.geospan.com/products-services.asp, accessed on May 22, 2009.
Gulch, E., Muller, H., Labe, T., Ragia, L., "On the Performance of Semi-Automatic Building Extraction", University Bonn, Germany, 1998.
How to Calculate Roof Pitches in 3D From 2D Drawings, Dec. 17, 2007, http://connected.typepad.com/connected/2007/12/how-to-calculat.html, accessed on May 22, 2009.
http://eagleviewmeasurements.com, "Eagle View Roof Measurement" accessed May 22, 2009.
http://estimagic.com/roofing/about-roofing-estimating.html, "About Estimagic Roof Estimator", accessed Aug. 22, 2008.
Miller, Mark R., Miller's Guide to Framing and Roofing, McGraw-Hill Companies, Inc., New York, 2005, pp. 131-136, 162-163.
Pictometry Online Demo, www.youtube.com/watch?v=JURSK7oOODO, accessed on Feb. 6, 2009.
Precigeo, http://www.precigeo.com/, accessed on May 22, 2009.
Roof Area Calculator, http://www.construction-resource.com/calculators/roof-area.php, accessed on May 22, 2009.
Roof Master Roof Estimating Software, http://www.vectortec.com/roofmaster _roofing_ estimating_ software.htm, accessed on May 22, 2009.
Rooflogic Drawings and Takeoffs From Satellite Images, http://www.rooflogic.com/Products/Satellite/, accessed on May 22, 2009.
SkyTek_Imaging, http://www.skytekimaging.com/ourservices.html, accessed on May 22, 2009.
Snyder, J., Barr, A., "Ray Tracing Complex Models Containing Surface Tessellations", California Institute of Technology, Pasadena, CA Jul. 1987, pp. 119-128.
Somay Roof Calculator, http://www.somay.com/roof_coatings/roof_ calculate/roof_ calculate.html, accessed on May 22, 2009.
Vincenty, T., "Direct and Inverse Solutions of Geodesics on the Ellipsoid With Application of Nested Equations", Warren AFB, Wyoming, Apr. 1975, pp. 88-93.
Ways to Determine or Calculate Roof Pitch or Roof Slope Using a Carpenters Level, http://roofgenius.com/roofpitch.htm, accessed May 22, 2009.
Delaney, Kevin J., "Searching for Clients From Above", The Wall Street Journal, Jul. 31, 2007.
Faugeras et al., "3-D Reconstruction of Urban Scenes From Image Sequences", In RIA, 2004, France, Sep. 11, 1997.
Henricsson, O. et al., "3-D Building Reconstruction with ARUBA: A Qualitative and Quantitative Evaluation," Institute of Geodesy and Photogrammetry, Switzerland, 1997, 12 pages.
http://www.precigeo.com/, Solar Professionals, Insurance Adjusters, Roofing and Landscape Estimators: Use Precigeo to Get Rapid, Accurate and Visually Compelling Sketches and Measurements, accessed on Mar. 15, 2010.
Poullis et al., "Photogrammetric Modeling and Image-Based Rendering for Rapid Virtual Environment Creation", University of Southern California, Institute for Creative Technologies.
Scholze, Stephan, "A Probabilistic Approach to Building Roof Reconstruction", A Dissertation Submitted to the Swiss Federal Institute of Technology Zurich, 2002.

(56) References Cited

OTHER PUBLICATIONS

Ziegler et al., 3D Reconstruction Using Labeled Image Regions, Eurographics Symposium on Geometry Processing, 2003.
Xactware Solutions, Inc., Brief on Behalf of Appellant, IPR2016-00593 and IPR2016-00594, filed Mar. 5, 2018.

SYSTEM AND PROCESS FOR ROOF MEASUREMENT USING IMAGERY

INCORPORATION BY REFERENCE

The present patent application claims priority to and is a continuation of the patent application identified by U.S. Ser. No. 15/005,977, filed Jan. 25, 2016, which is a continuation of U.S. Ser. No. 14/018,943, filed Sep. 5, 2013, which is a continuation of the patent application identified by U.S. Ser. No. 13/774,478, filed Feb. 22, 2013, which is a continuation of the patent application identified by U.S. Ser. No. 12/470,984, filed May 22, 2009, all of which the entire contents of which are hereby incorporated herein by reference. The present patent application additionally claims priority to the patent application identified by U.S. Ser. No. 13/786,699, filed Mar. 6, 2013, which is a continuation of the patent application identified by U.S. Ser. No. 12/470,984, filed May 22, 2009, the entire contents of both of which are hereby incorporated herein by reference.

FIELD OF INVENTION

The present invention is in the field of measuring roofing dimensions and other attributes, and more particularly pertains to the use of aerial imagery in that field.

BACKGROUND

Roof measuring, for example, dimension, length and areas has been done for many years, such as in connection with for estimating and bidding roofing jobs. Also, for many years, companies and products have offered such estimation services and reporting software reports using aerial imagery on which roof line outlines are traced, dimensions and areas are automatically based on those tracings, and vertical elevations (via pitch or otherwise) are included in mathematical models.

The present invention is an improvement on such aerial imagery, systems and processes, providing non-obvious features that enhance convenience, flexibility, and/or accuracy.

SUMMARY

The claims, and only the claims, define the invention. The present invention includes several, but not necessarily all, of creating a first layer and a second layer, in computer memory and substantially overlapping at least a segment of line from said first layer with at least a segment of another line from said second layer, wherein said first non-dimensional attribute is different from said second non-dimensional attribute; and/or an interactive computer file, said interactive computer file including: length numeric values and at least one user length field enabling a client with said interactive file to override at least one of said length numeric values, where said area operator may automatically recalculate area based on said length field override; and/or, providing at least one computer input field for a user to input first location data generally corresponding to the location of the building; on said imagery of an area providing a visual marker that is moveable on said computer monitor around a region, said marker initially corresponding to said first location data, wherein said marker may be moved to a final location on top of the building to more precisely identify the location of the building roof structure; and providing a computer input capable of signaling user-acceptance of the final location of said marker; and/or other features, optionally combined in various ways as set forth in the claims.

BRIEF DESCRIPTION OF THE PREFERRED EMBODIMENTS

Figure 1:
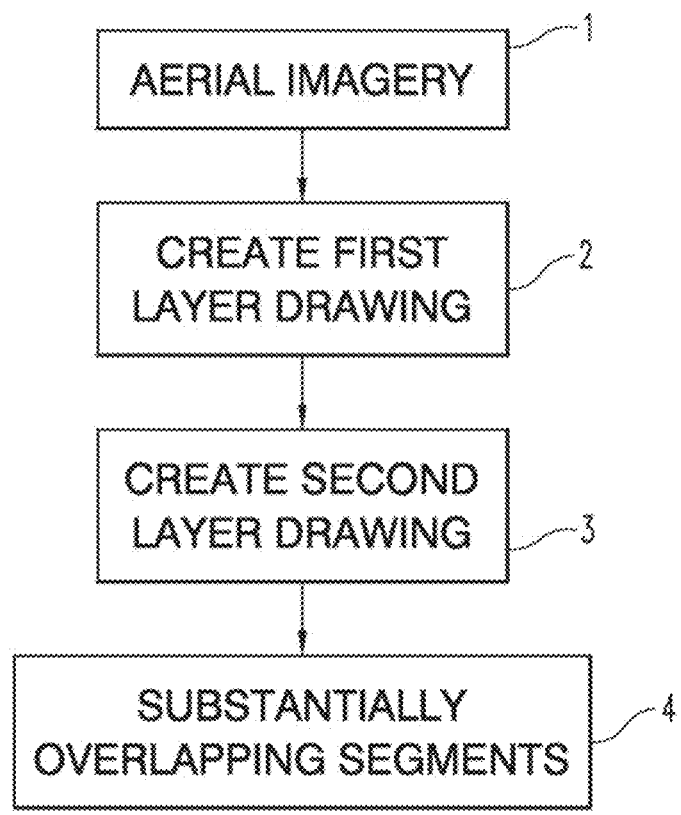
FIG. 1 is one example of a flow chart of acts according to the present invention.

For the purposes of promoting an understanding of the principles of the invention, reference will now be made to the examples, sometimes referred to as embodiments, illustrated and/or described herein. Those are mere examples. It will nevertheless be understood that no limitation of the scope of the invention is thereby intended. Such alterations and further modifications in the described processes, systems or devices, any further applications of the principles of the invention as described herein, are contemplated as would normally occur to one skilled in the art to which the invention relates, now and/or in the future in light of this document.

As used in the claims and the specification, the following terms have the following definitions:

The term "adjustment roof plane" means a roof plane, having at least three border lines, that may be hidden (partially or totally) from view from some or all aerial imagery and which may be included to add to (or subtract from) an aggregate roof area or other attributes.

The term "aerial imagery" means pictures, normally including photographs (visual light, infrared, color, black and white, or otherwise) taken from an overhead view (straight down, oblique, or otherwise) with respect to a building roof. This may include imagery taken from airplanes, satellites, balloons, or otherwise.

The term "attributes" means one or more distinguishing or identifying characteristic.

The term "border line" means a line segment, straight, curved, free form or otherwise that generally corresponds with the edge of a roof plane.

The term "building" means a real estate structure, such as for example, a house, condominium, office building, outbuilding, garage, warehouse, factory or otherwise.

The term "client" means a person or entity that orders or obtains an aerial imagery report.

The term "computer input" means data, information and/or signals provided by a computer user. This may include numbers, words, mouse clicks, "enter", check boxes, dialog boxes, and otherwise.

The term "computer monitor" includes any computer screen or other visual output, including projectors, flat panel screens, LCD screens, LED screens and otherwise that provide visual output from a computer.

The term "computer processing means" means computer hardware and software, including computer memory, microprocessors, computer code and computer logic to provide digital computing.

The term "contrast" means discernable relative differences in lightness and darkness.

The term "deliverable" means that which is or may be delivered to a client, including printed and/or electronic reports and information.

The term "digital" means using numeric digits, specifically including binary digits.

The term "direct proportion" means that one or more variables that change as a function as another value in a generally linear function.

The term "dissects" means to sub-divide into two or more parts.

The term "electronic drawing" means to draw lines and/or shapes electronically via computer. This can include pixel-based drawings, vector-based drawings, and/or otherwise.

The term "field" means a location for computer data input and/or output of a value having at least one corresponding associated place in computer memory.

The term "final location" is the relative spot for placing a marker. This normally corresponds to unique latitude and longitude coordinates.

The term "generating" means to make or create.

The term "imagery database" means a computer database containing aerial imagery computer files and the associated location coordinates.

The term "interactive computer file" is a computer file in which a user may input and/or override one or more numeric values stored in memory as part of the file.

The term "internet-based imagery" means imagery, such as aerial imagery, which is accessible through an internet access connection. One popular example is Google® Earth.

The term "latitude and longitude coordinates" mean numeric coordinates for a location on the planet corresponding to latitude (east, west) and longitude (north, south).

The term "layer" means a part of a graphic computer file that visually overlays one or more other parts and which has at least partially transparent portions allowing visualizations of parts/layers below it.

The term "lines" means a straight, curved, and/or free form segment.

The term "location data" means information which uniquely identifies geographic position. This may include latitude and longitude coordinates, street addresses and/or otherwise.

The term "non-dimensional attribute" means an attribute other than a numeric value, such as other than length, width, height, or area.

The term "numeric values" means alphanumeric numbers, and/or their binary equivalent.

The term "operator" means a mathematical function including, but not limited to multiplication, division, addition, subtraction, sum, average, square root and/or the foregoing with or without constant and/or co-efficient.

The term "orientation" means the direction of something with respect to something else.

The term "outline" means the path or collection of lines generally coinciding with the outside of a shape.

The term "outline drawing" means drawing of lines around an outline.

The term "over said imagery" means position on top of and in alignment with underlying Imagery.

The term "override" means to substitute or replace one value for another value. This may be done with numeric values, non-dimensional attributes and otherwise.

The term "perimeter lines" means a line or lines that outline the outer most edge of a roof structure. This can include, but is not limited to, a roof free edge with a gutter and to a roof free edge without a gutter.

The term "pitch numeric value" is a single numeric value corresponding to the pitch or slope of a portion of roofing.

The term "proportioning" means to increase or decrease the size of a line, outline or other object to directly proportional to the change in another object.

The term "region" means a location on earth that is depicted in aerial imagery. Ordinarily, it will include at least one entire building structure, and preferably, will include at least some features, such as streets, trees, or other buildings adjacent the building structure.

The term "report" means one or more pages or screen shots, or both, made available to a user including aerial imagery and/or data from such imagery. This includes, but is not limited to, one or more interactive computer files.

The term "roof flashing edge" means an edge where roofing meets with a generally vertical structure, such as a wall, typically with flashing.

The term "roof free edge with a gutter" means the unbound edge of a roof with a rain drainage gutter.

The term "roof free edge without a gutter" means the unbound edge of a roof without a rain drainage gutter.

The term "roof hip" means an edge where two roof planes meet to form a generally upward sloping ridge.

The term "roof pitch" means the slope of a roof plane. It may be expressed in angles, ratios, or otherwise. This includes stating the rise over run, as well as stating merely the rise in view of an assumed or industry standard run. For example, a slope of 6 inch rise for every 12 inch run (horizontal") may be stated to be a "6" pitch.

The term "roof plane" means a generally planer, segment of a roof.

The term "roof ridge" means an edge where two generally upward sloping roof planes meet.

The term "roof structure" means the top of a building which shelters the building from weather.

The term "roof valley" means an edge where two generally downward sloping roof planes meet.

The term "street address data" means the location typically used by postal identification, typically including at least one numeric value and at least one street name, and further typically including a zip code or other postal code and/or a town and state or province.

The term "street address look up field" means a computer field for entry of street address data.

The term "substantially overlapping" means that where one line, in whole or in substantial part, coincides with another line in terms of direction and overlap. This may include situations where the respective lines are of substantially different length, or not.

The term "substituent triangles" means two or more congruent triangles which collectively form a subset of another geometric shape.

The term "tracing" means drawing around an outline or along a line or feature depicted in Imagery.

The term "user-acceptance" means an affirmative step or series of steps or computer input, undertaken by user to make a selection.

The term "vector direction" means, in relative space, either two dimensionally or three dimensionally where a vector is pointing.

The term "visual marker" is a shape, pointer, label, icon, avatar or other indicator which is movable or displayable on a computer screen and which may be visually differentiated from other objects on the computer screen.

The term "visually depicting" means to show or illustrate something on a computer monitor as a graphical image.

Articles and phases such as, "the", "a", "an", "at least one", and "a first", are not limited to mean only one, but rather are inclusive and open ended to also include, optionally, two or more of such elements.

The language used in the claims is to only have its plain and ordinary meaning, except as explicitly defined above. Such plain and ordinary meaning is inclusive of all consistent dictionary definitions from the most recently published Webster's dictionaries and Random House dictionaries.

Referring to the drawing figures, these are only examples of the invention, and the invention is not limited to what is shown in the drawings.

DETAILED DESCRIPTION OF THE DRAWINGS

Referring to FIG. 1, a process for determining attributes of a roof structure 501 (see FIGS. 4B, 4C) of a real-world three-dimensional building 500 may optionally comprise several acts. This may include viewing on a computer monitor 100 in digital aerial imagery 1 of a region 502 (see FIGS. 4B, 4C) including the roof structure 501. Ordinarily, the roof structure will have one or more roof planes, and unless the roof is a simple single-plane roof, will have at least two or more roof planes. In FIG. 1, the act of creating of a first layer drawing 2 is undertaken. Such act may be used by the ultimate end-user enabled by the software, but optionally and more preferably is done by a commercial vendor based on an order placed by a user. Such order may be placed by telephone, on-line, such as on computer screen 100 as shown in FIGS. 4A-4D, by mail, email or otherwise.

Figure 5A:
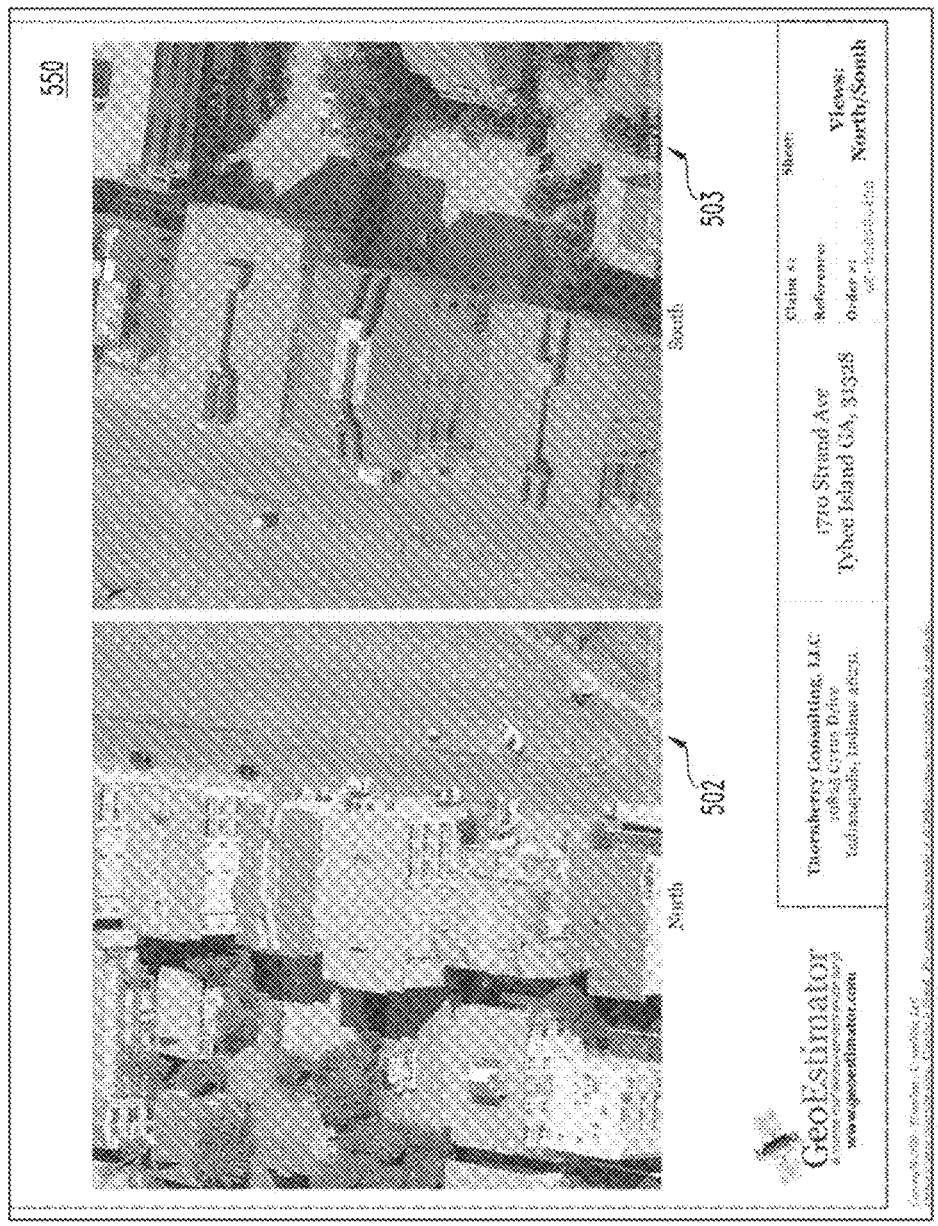
FIG. 5A is an example of reporting.
Figure 5B:
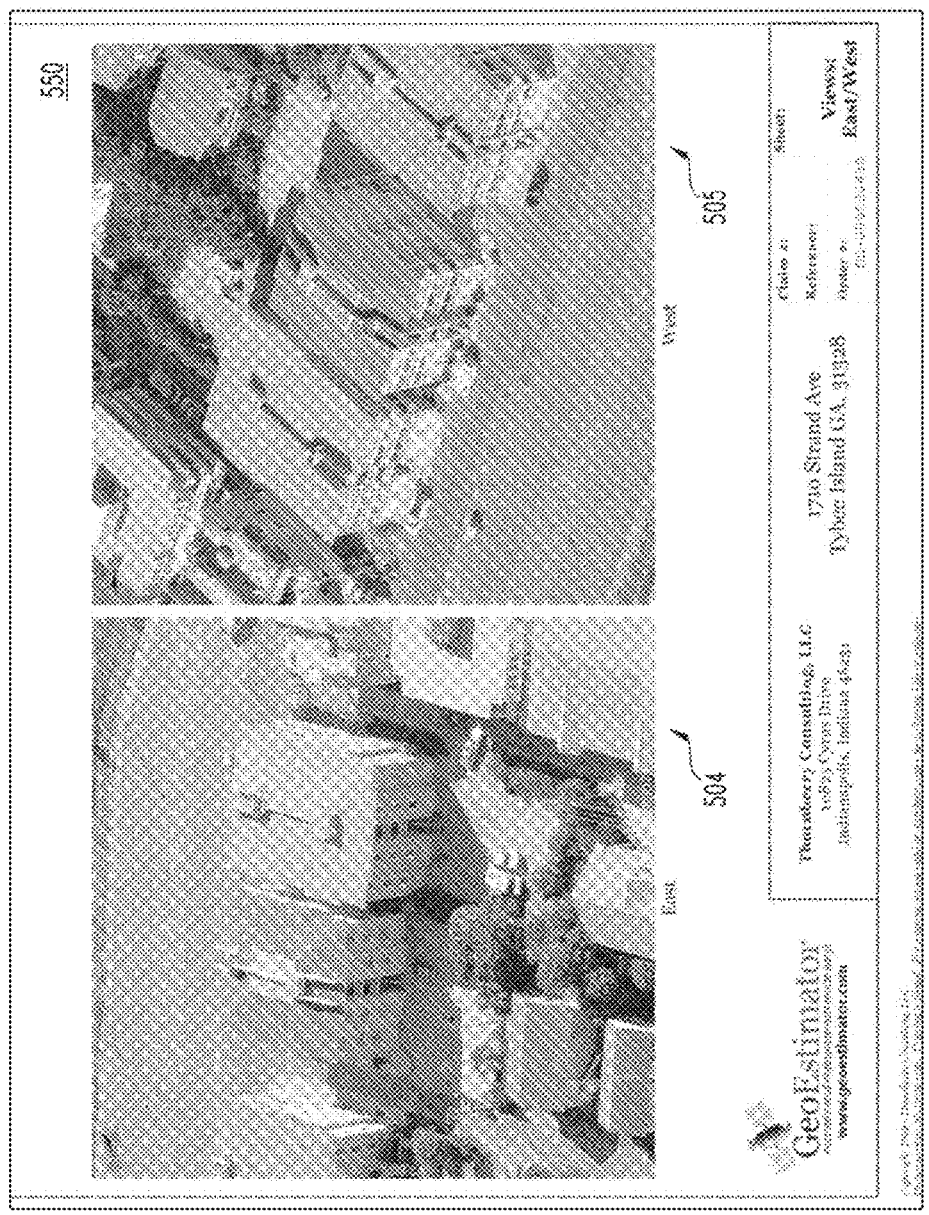
FIG. 5B is another example of a screen shot and/or reporting.
Figure 5C:
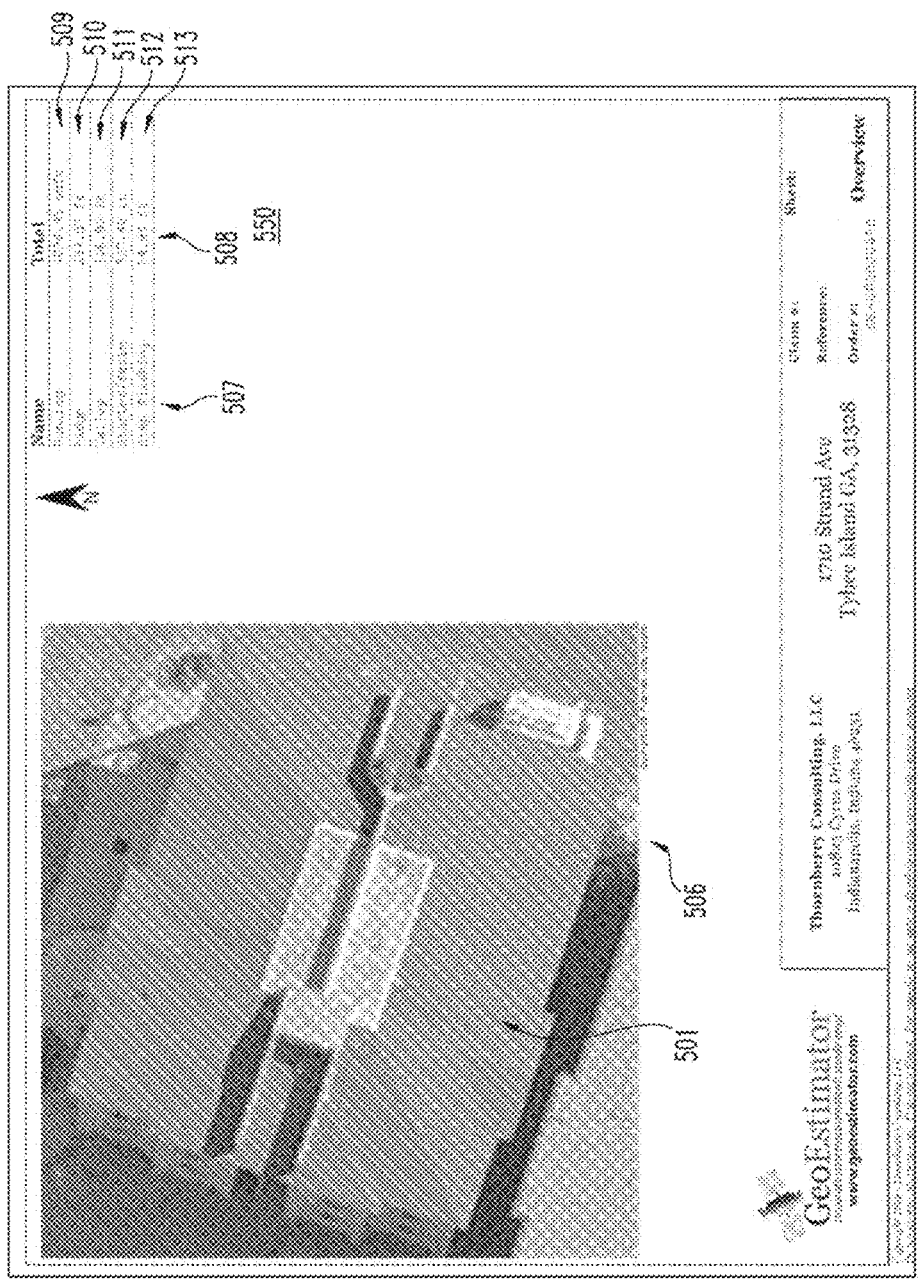
FIG. 5C is another example of a screen shot and/or reporting.
Figure 5D:
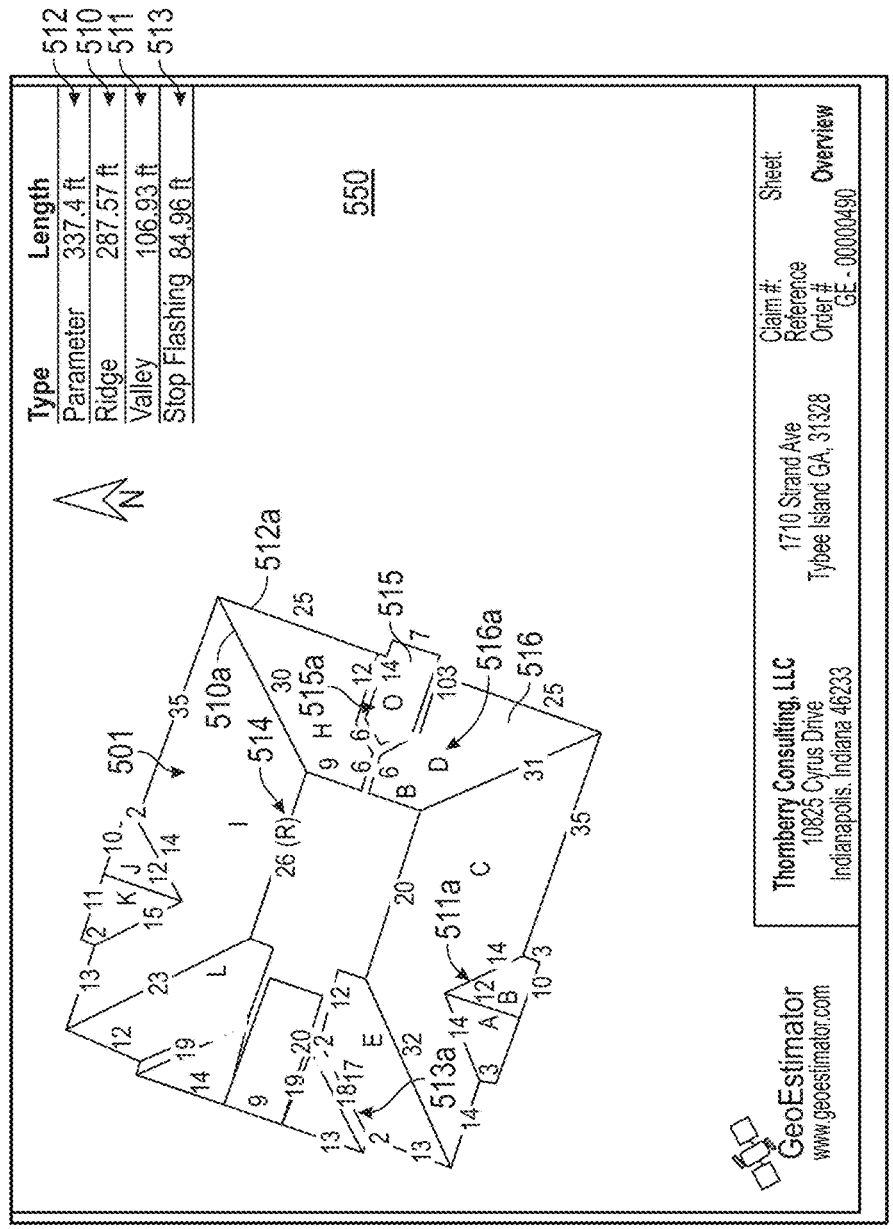
FIG. 5D is another example of a screen shot and/or reporting.
Figure 5E:
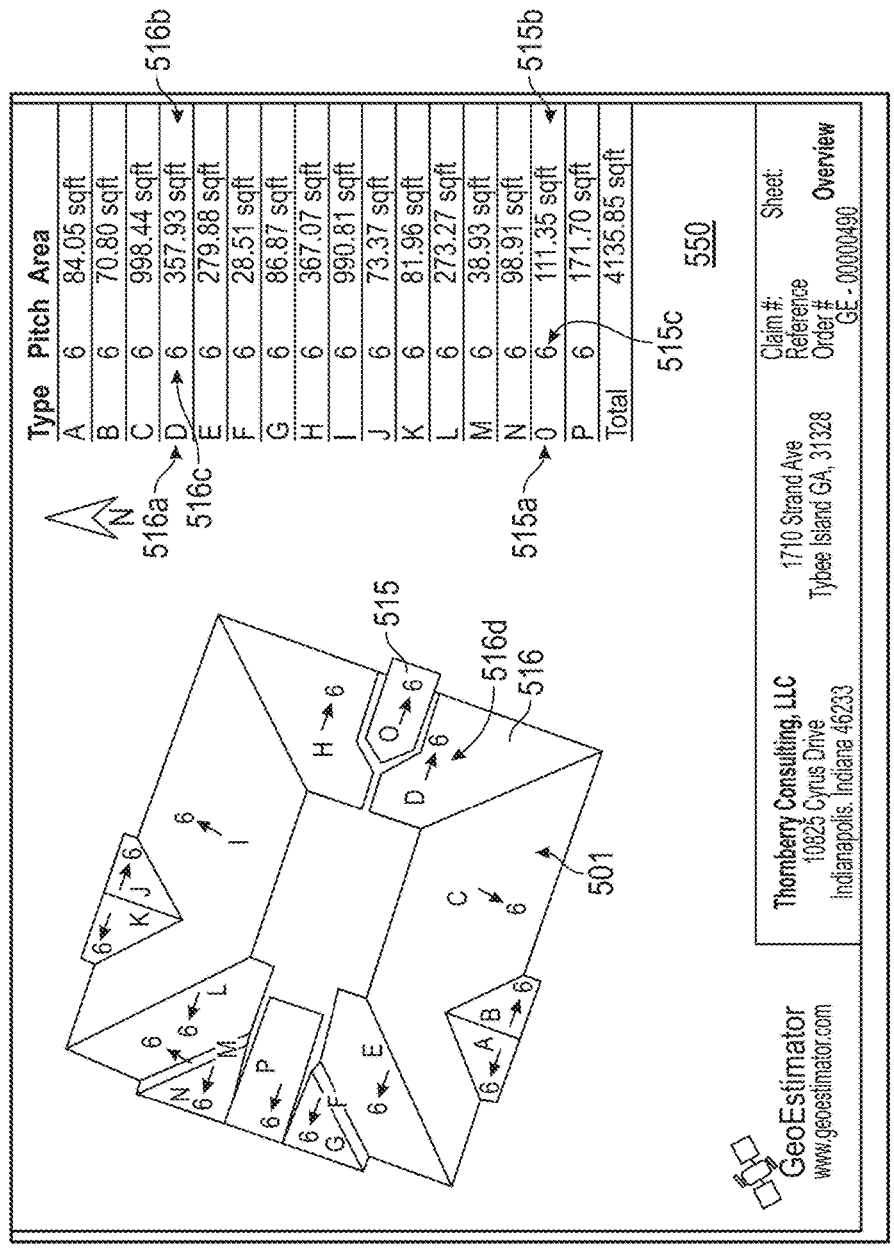
FIG. 5E is another example of a screen shot and/or reporting.
Figure 5F:
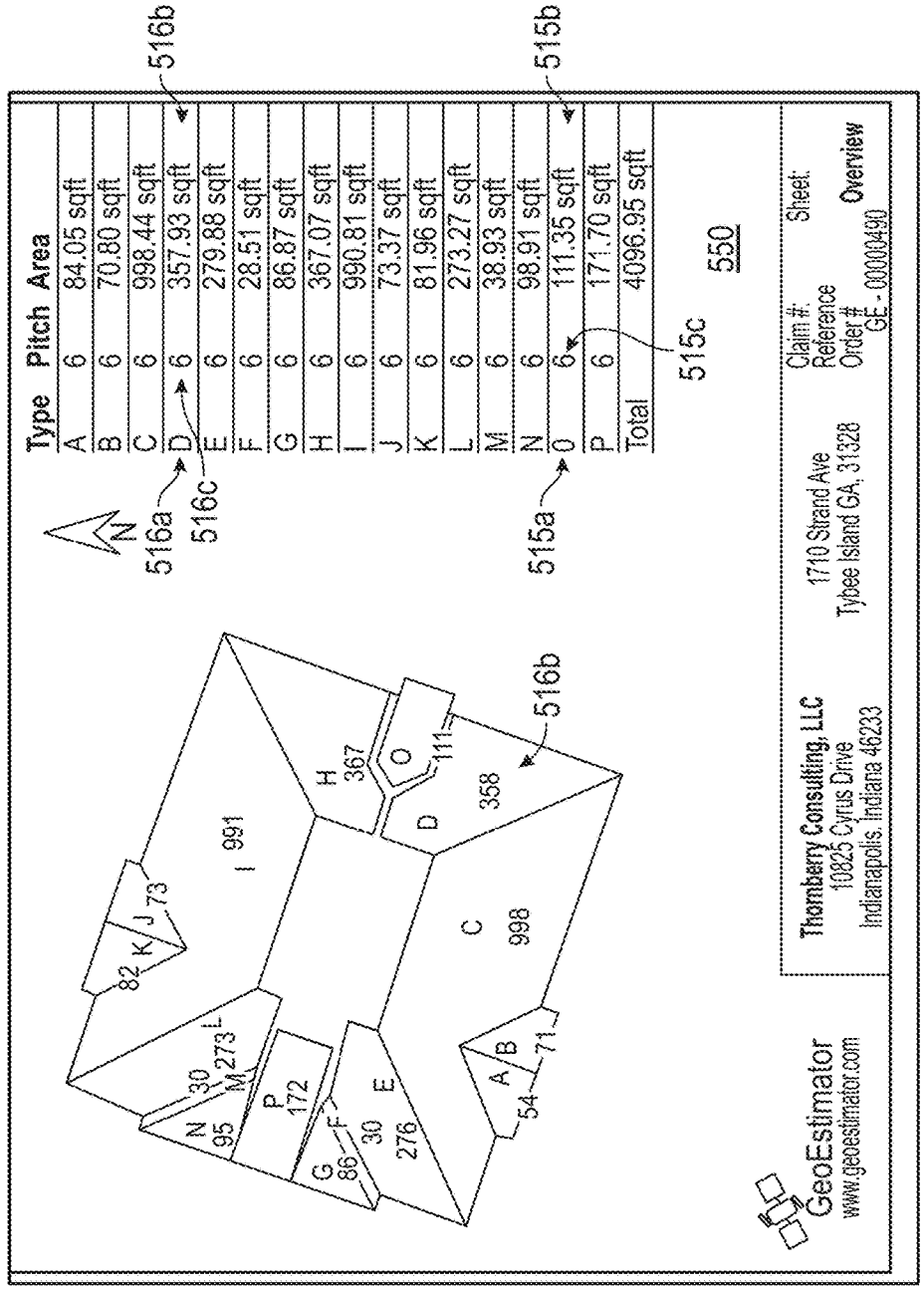
FIG. 5F is another example of a screen shot and/or reporting.
Figure 5G:
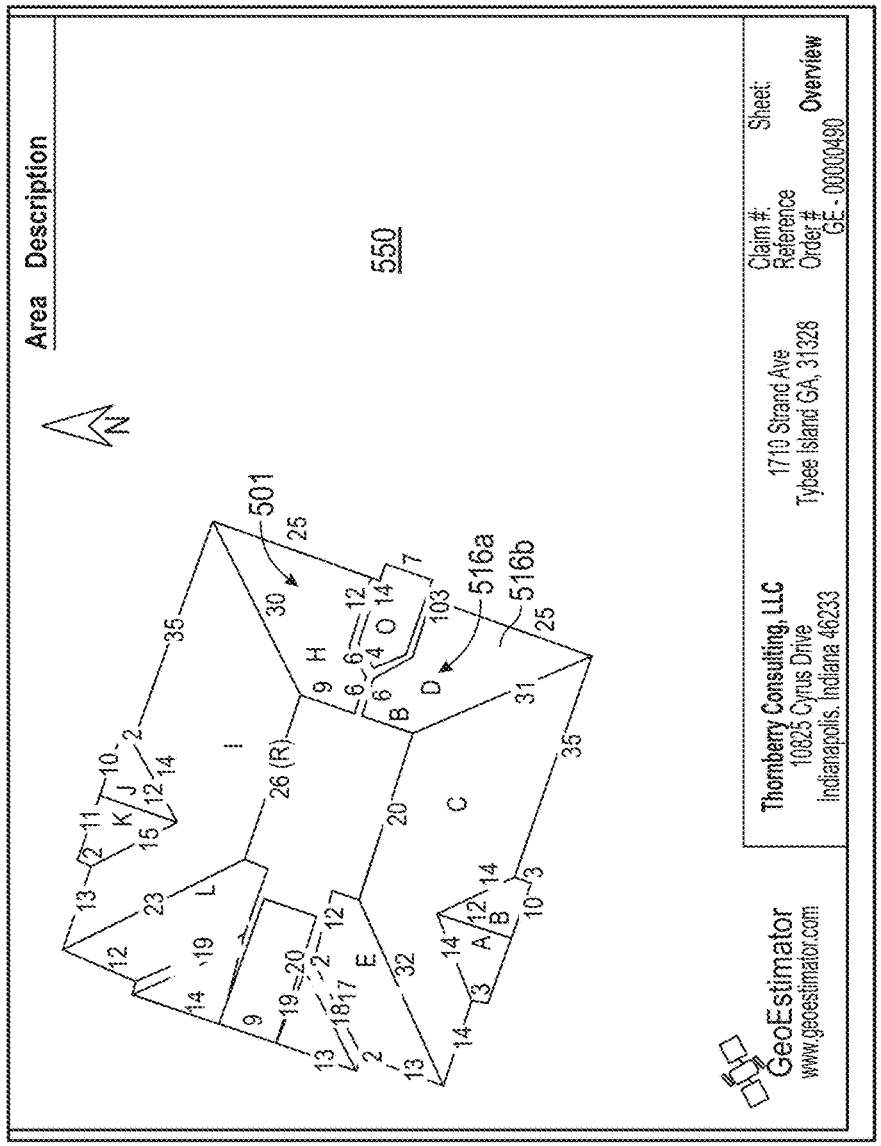
FIG. 5G is another example of a screen shot and/or reporting.
Figure 5H:
FIG. 5H is another example a screen shot and/or of reporting.
Figure 5I:
FIG. 5I is another example of a screen shot and/or reporting.
Figure 6:
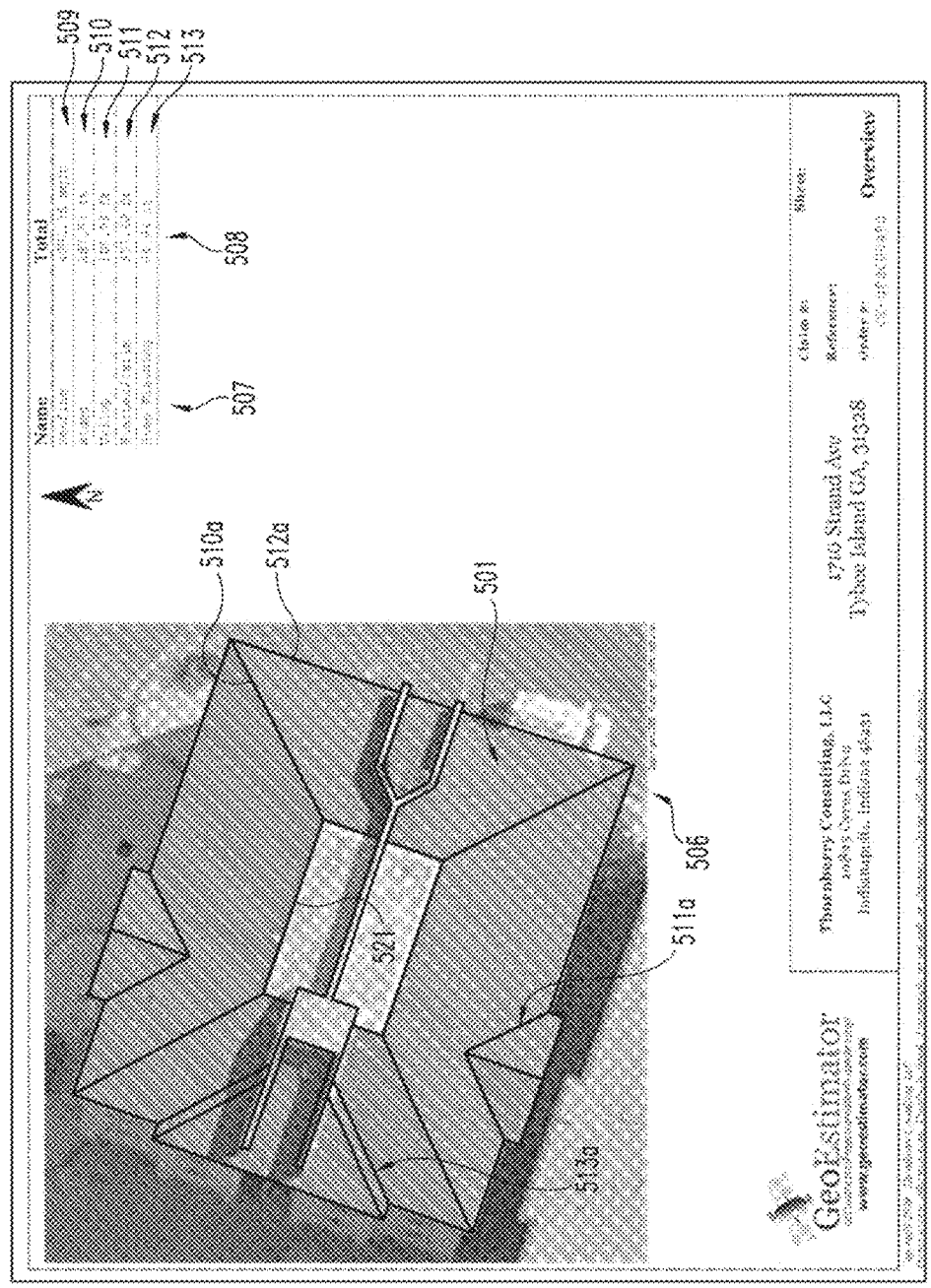
FIG. 6 is another example of a screen shot and/or reporting.

The creation of the first line drawing 2 may be done a multitude of ways, in one example is illustrated in FIGS. 5A-5I and FIG. 6, discussed further below. Likewise, in FIG. 1 creating a second layer drawing 3 is another act. For example, in FIG. 5D, various roof planes are denoted by letters A-P. For example, the roof plane 515 denoted by the letter "O" may be drawn in a second layer, whereas roof plane 516 indicated by the letter "D" may be in a first layer. In such example, roof plane 515 and roof plane 516 have substantially overlapping segments 4 (see FIG. 1). For example, along the upper edge of plane 515 appears the number "5" denoting a five foot line; whereas, plane 516 has the substantially overlapping line denoted by "7" indicating a seven foot line segment of roof plane 516. Such seven foot roof segment of plane 516 may comprise a perimeter line (part of the 56.78 feet perimeter length of plane D depicted in table 520 of report 550 of FIG. 5I); whereas, the substantially overlapping five foot length of plane 515 may comprise a second non-dimensional attribute, namely flashing, such as step flashing line (part of the 37.01 feet of step flashing for plane O depicted in table 521 of FIG. 5I). Accordingly, this is one example of substantially overlapping lines such as segment of line A and segment of line E set forth in the claims, each having respective first and second non-dimensional attributes. This allows for separate reporting of such non-dimensional attributes, such as the length of perimeter, the length of step flashing or otherwise. Such non-dimensional attributes may be of any type. As mere examples that have use in the roofing industry include the non-dimensional attributes of roof ridge, roof hip, roof valley, roof flashing edge, perimeter line, roof free edge with a gutter, and roof free edge without a gutter. For example, line 510a in FIG. 6 is an example of a roof ridge, whereas line 511a and line 513a are each examples of a roof valley. Line 512a in FIG. 6 is an example of a perimeter edge, which also happens to comprise a roof free edge without a gutter. Optionally, while not illustrated, if line 512a had, or were to have, a gutter along it, then it would be in that case a perimeter line and be a roof free edge with a gutter. FIG. 6. also depicts an optional table and/or fields showing the non-dimensional attributes at 507 and the total values for them at 508. This can include the area of roofing 509, the linear ridge feet 510, linear valley feet 511, starter/perimeter linear feet 512, step flashing 513, and/or others.

Another optional feature is computer processing means for calculating a vector direction corresponding to roof pitch for a roof plane. Optionally, this may be based on at least one of said non-dimensional attributes of roof plane outline lines and their orientation. Such computer processing means typically includes computer logic and/or code with a set of rules to establish such vector. Examples of such vector are shown in FIG. 5E. Specifically, they are preferably shown as arrows. In the illustrated example, they are ordinarily indicated as arrows pointing in the downward direction, corresponding to the downward direction of rain flow. Optionally, there may be other illustrations, including an upwardly directed arrow, although this is not preferred. For example, vector 516d is shown in a downwardly directed arrow with a number 6 next to it. This depicts the vector corresponding roof plane 516, namely plane D previously discussed. As seen, the value "6" for the pitch is entered at field 516c in the table also showing the area (for that particular roof plane D at field 516a) 357.93 sq. ft. as shown at field 516b. Note further with respect to roof plane 515 (plane "O") as illustrated in the table at field 515a, it likewise has a roof pitch of "6" shown at 515c. The total area of roof plane "O" is 111.35 sq. ft. in this particular example, as shown at 515b.

An example of computer programming to determine pitch direction is as follows.

1.) Pitch will run towards a perimeter line. If only one perimeter line pitch goes towards the perimeter (most standard roofs, all but the ends of hips);

2.) If there are multiple perimeters that are not parallel, look for ridge. If there is only a single ridge line and it is parallel to one of the perimeter lines, pitch runs from the ridge towards the perimeter. (Perimeters that are not straight and have small outcroppings where the roof extends further down the same slope).

3.) If a shape has no multiple perimeters and multiple ridges where none are parallel, take an average of the ridge angles and see if that direction is perpendicular to a perimeter line. If so, that direction is the direction of the pitch. (The end of hip roofs).

Most planes are resolved by the above acts, 2 and/or 3. Acts 4 and 5, below, are also optional but preferred, and address totally enclosed roof planes which most standard roofs do not have.

4.) If there are no perimeter lines and a single ridge line, the pitch is from the ridge.

5.) If there are no perimeter lines and multiple ridge lines, once finding the pitch for all other shapes look at the ridges and the shared shapes. If the shared shape has a pitch directly away (is perpendicular) from the shared ridge, use that ridge as if it were 2 (from above). If the other pitch goes at an angle to the ridge, look at other ridges.

The case where you can make it past act 5 and not have pitch direction is for completely enclosed shapes where all sides are valleys at the intersection of multiple planes, set forth in this optional act:

6.) take the average slope of all other planes connected via shared lines and average the slope direction of the planes, whose pitch runs into the plane in question; use that direction as the pitch direction for the plane.

Variations on that logic, including changing the order, and/or combining or splitting acts, may optionally be used. For example, rather than beginning with logic looking to run pitch towards a perimeter, the logic could begin to look to first run the pitch vector away from a ridge line, although this is less preferred.

As illustrated in report 550 as seen in FIG. 5E, the visual depiction of pitch vectors, such as 516d may help visualize the shape, orientation, pitches of the roof structure and/or roof planes.

Optionally, one or more deliverables to the client include one or more reports such as report 550. Report 550 may include one or more of the features as depicted in the various drawings of FIGS. 5A-5I and/or FIG. 6 and/or FIGS. 7A-7D, alone or combination.

Optionally, such report may be printed on a piece of paper, or provided on a non-interactive computer file such as a .pdf (Adobe® Acrobat®) type image or otherwise, illustrated on a computer screen for the user to print out (web based or otherwise) and/or delivered on recordable media such USB drive, floppy disk, CD, DVD, email attachment or otherwise. However, preferably, such file is delivered as an interactive computer file. For example, referring again to FIG. 5E, the pitch value as shown in the table, such as the 6 pitch for plane D and 516c allows the person, the end-user or otherwise, to enter at least one pitch numeric value. This pitch numeric value may correspond to roof pitch of the roof plane. Hence, in FIG. 5E, one or more of the pitch values in computer fields corresponding to the table, may be empty or null. They may allow a person, such as an end user, to data input via their computer, the pitch value. For example, this may be based on the end user, or one of their agents, taking field measurements of the roof to provide the input. As such, value 516c may be entered to be "6" corresponding to a 6 pitch (e.g., 6" vertical rise for every 12" of horizontal run). Such value "6" may be changed, updated, or overridden.

As can be appreciated in three-dimensional geometry, given the shape of plane D (516) the value of the pitch ordinarily will affect the overall area of such roofing (see e.g. FIG. 5F, area value 516b).

Mathematical equations demonstrating-area relationship for a sloped, rectangular roof plane are known, an example of which is set forth below:

Area=$W \times Z$

Z=square root of:$(X^2+Y^2)$

Where:
W=width
X=horizontal run
Y=vertical rise
Z=hypotenuse of X-Y-Z right triangle.

Other, geometries may be calculated using known math, coefficients and/or tables. See for example: *Miller, Mark; Miller's Guide to Roofing* (2005) ISBN 0-07-145144-7. Thus, in combination with the perimeter measurements supplied with the report based on the creation of roof plane D from the imagery, the addition of the roof pitch value may lead to the calculation such as in the example 357.93 sq. ft. shown at 516b. Likewise, for plane O, the value of "6" may be entered in the table at 515c to arrive at the area calculation 515b as previously described. It should be appreciated, that optionally these pitch values may be provided by the end user or other persons based on field measurement. However, optionally, they also may be based on measurements and/or computer calculations precisely, by estimate or otherwise, such as by viewing oblique imagery such as region image 502 shown in FIG. 4B. In such case, for example, a vendor may provide default values (and/or absolute values) for the pitch and the table shown at FIG. 5E. In an interactive computer file with such fields being interactive, and with operators to calculate area taking into account pitch, preferably part of said file, even with such default values based on oblique imagery the end user would be free to override them, such as for example if they determine that field measurements indicate a different pitch.

Another optional feature may include other attributes deliverable to the client including an interactive computer file. For example, the length values of lines forming an outline of a drawing may be overridden. For example, referring again to FIG. 5D, a reference line 514 is depicted. In this one example, it is depicted in the parenthetical quote ("R"), although this is not required. In such case, it is denoted "26" corresponding to 26 ft. in length. Note that all dimensions in this case may be converted to or express in metric, rather than English units, although for purpose of illustration English dimensions are utilized here.

In such case, even though the referenced dimension 26 is based on scaling that line off of the imagery, such as imagery 506 (see FIG. 6; FIG. 5C) there is an opportunity for greater precision. Such interactive computer file, for example, in the report page shown at FIG. 5D, the value 26 depicted there in connection with the reference may actually be the location of a data entry field. In such case, the field operator may determine that the precise measurements are not 26 feet, but rather are 26.15 feet. In such case, the user operator may enter in their computer by typing in the value "26.15" the reference line field, thereby overriding it from 26 to 26.15 in this hypothetical. In such case, the interactive computer file may use co-efficient and other ratios to proportion (by multiplication or otherwise) some, or preferably, each of the other lines of an outline in direct proportion to the plane field override. While the foregoing is mentioned in terms of the referenced mentioned 514, optionally the interactive computer file may provide multiple reference directions and/or all line values in their report may, optionally, be interactive and override fields. As mere examples, in FIG. 5D this could include fields for 510a, 511a, 512a and/or otherwise, including without limitation most or all numeric values.

Moreover, while not illustrated, optional report 550 may include a separate table and/or field entry point apart from the drawing of the building roof structure 501 in which the reference line may be overridden instead or, or in addition to, fields directly overlying the aerial imagery and/or the drawn lines.

Optionally, but preferably, in addition to the length of the other lines being proportionally recalculated, likewise the area values, such as depicted in the area column of the table at FIG. 5E as well as the area values on FIG. 5F and/or FIG. 6 (see the total roofing area value 509 of 4096.95 sq. ft. may be automatically recalculated. This may be done in a separate application, in the interactive computer file (including with embedded operators), both or otherwise.

Various area calculations used in connection with computer data processing means are available based on known geometry. These could include things as simple as multiplying length times width of a single rectangle. They also may include modifying such area to take into account the additional area generated by pitch, as previously discussed. However, while not limited to this, preferably, taking advantage of the pixilated imagery that may be used, one optional feature in determining one or more areas of the respective roof planes is as follows. If you know the points (corners) of the shape and can order them in a clockwise (or optionally, counter-clockwise) fashion following the perimeter or outline of the shape, then the following algorithm can apply. Starting at the first endpoint, 0 (zero), while N+1 is less than the total ordered end points take the triangle made by the 3 points 0, N, and N+1 and compute the area of the triangle created, which is done by the dot product method using vectors created by going from 0 to N and 0 to N+1. Add this area to a running sum.

Note that when the three ordered endpoints are not in the proper order (they create a convex perimeter or outline of the shape that reduces the overall area as opposed to adding to), the dot product method of finding the area will return a (−) negative area which subtracts from the overall area in the running sum.

Dot product (2-Dimensional Vectors) can be expressed in the equation:

$$uv = u_1v_1 + u_2v_2$$

This can be used to find the area of the square that the two vectors produce. Dividing the result by two (2) gives the area of the triangle the two vectors produce.

Thus, in this way an example is provided of computer data processing means that dissects the outlines of the roof planes into substituent triangles and calculates the area of such triangles. The areas are aggregated to provide the area of respective roof planes, and the areas of such respective roof planes may in turn be aggregated (summed) to arrive at the total area of the roof structure. Examples of this are shown in the table in FIG. 5F and/or table 517 in FIG. 5H. Note also in FIG. 5H the report 550 may also include other tables and information, such as ridge length table 518 and/or valley length table 519.

Figure 2:
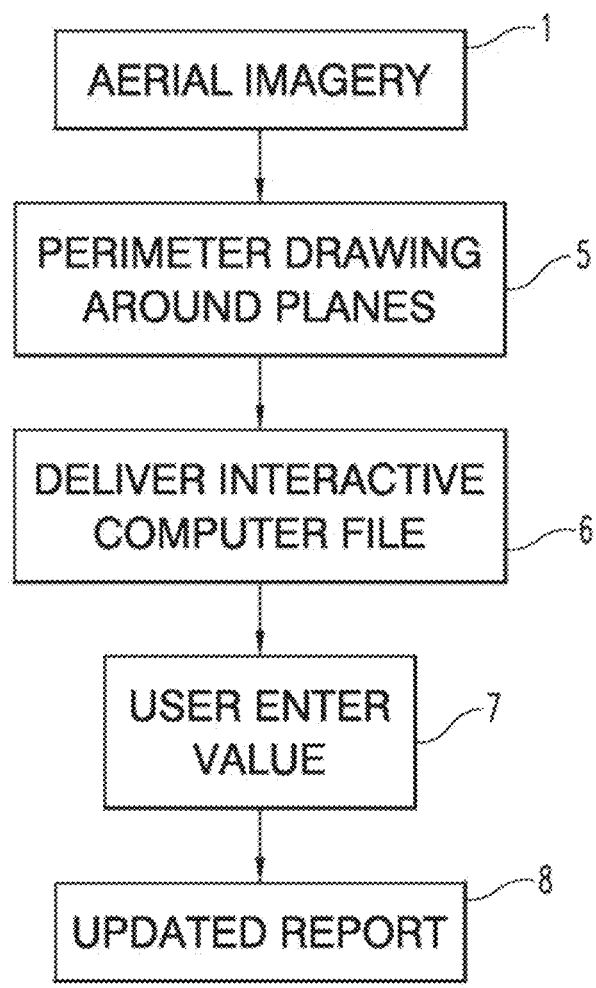
FIG. 2 is another example of a flow chart of acts according to the present invention.

Hence, in FIG. 2, aerial imagery 1 is used and perimeter drawings around roof planes are acts. Thereafter, one or more interactive computer files are delivered 6. The user may enter values in the interactive computer file 7, such as pitch, length, or otherwise as discussed. This may result in the act of updating the report 8.

Figure 4A:
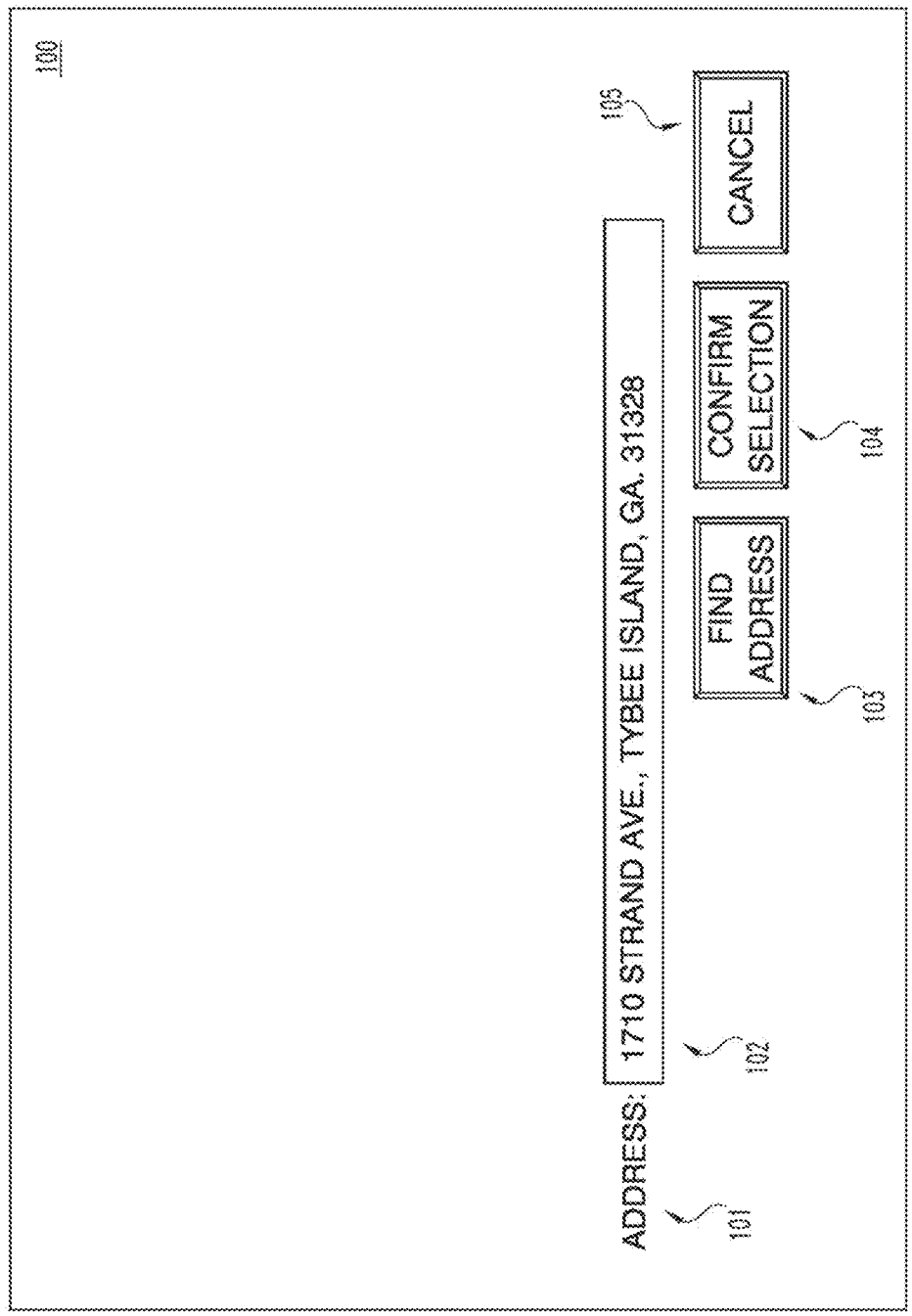
FIG. 4A is one example of a computer screen shot to enter an address.
Figure 4B:
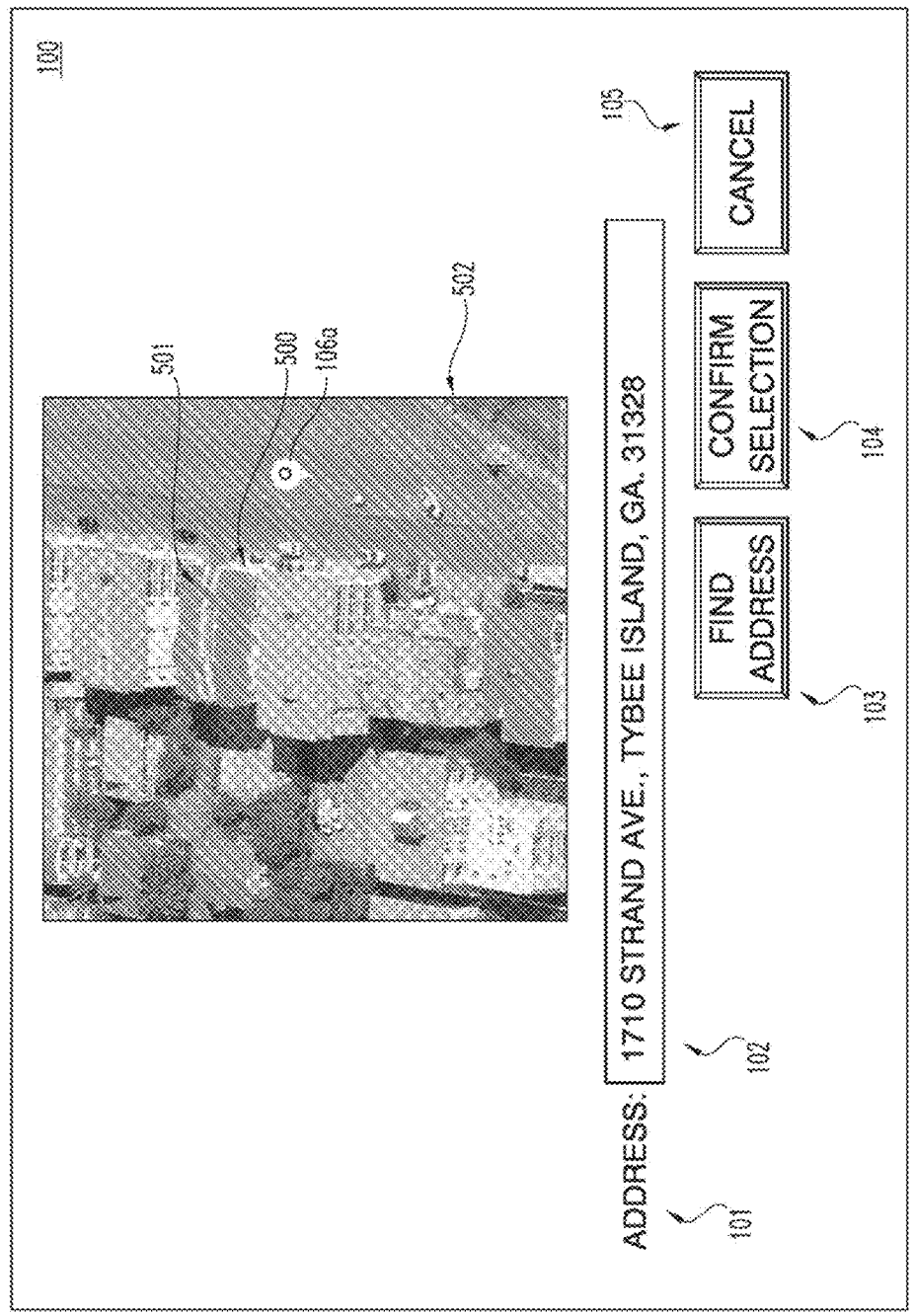
FIG. 4B is one example of a computer screen shot depicting imagery and a marker based on an address.
Figure 4C:
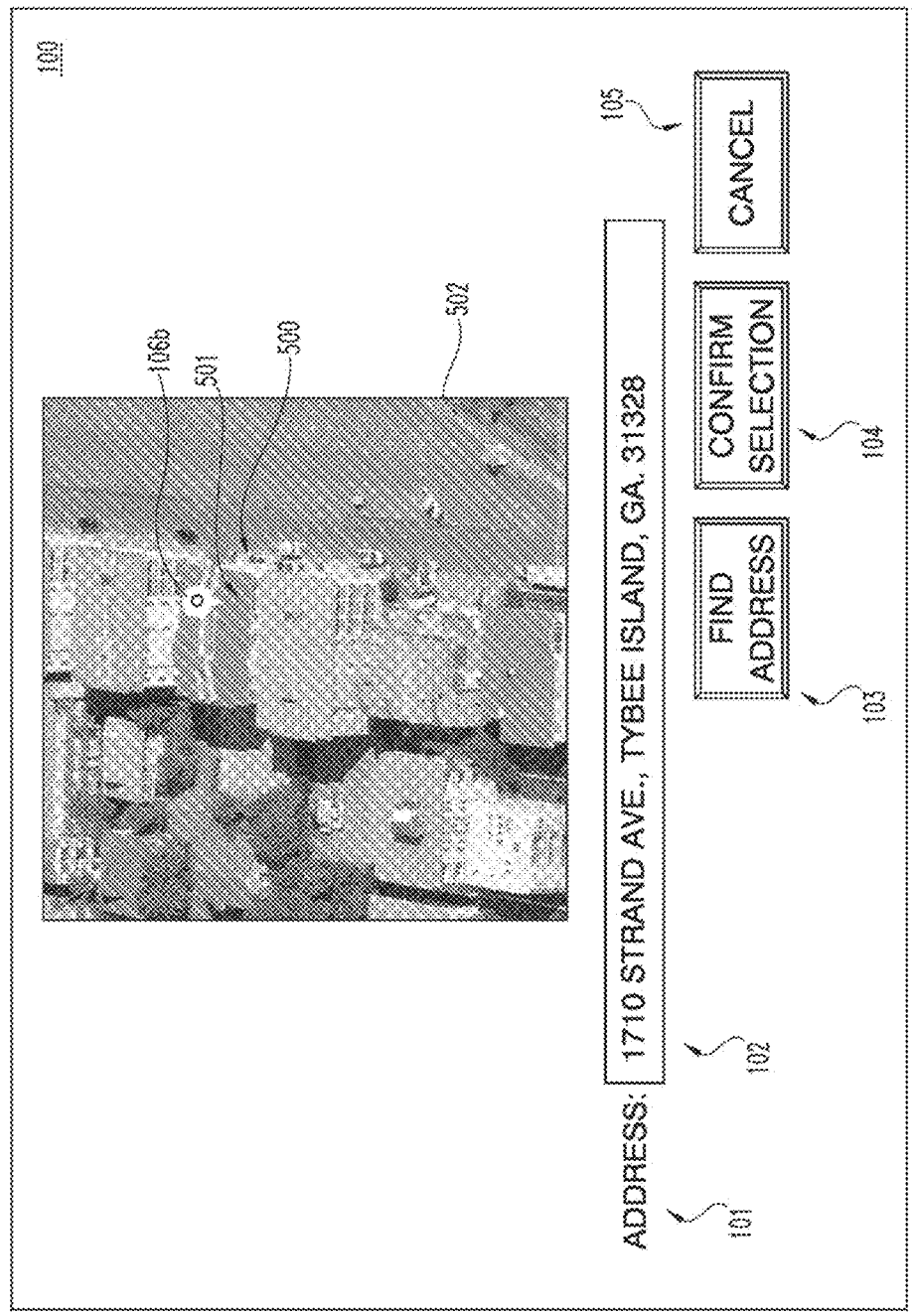
FIG. 4C is a computer screen shot like FIG. 4B with the marker moved over a selected building.
Figure 4D:
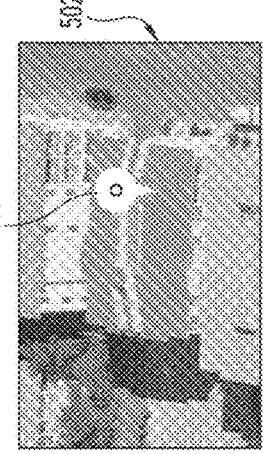
FIG. 4D is a computer screen shot and/or reporting confirming selection of a building.

Another optional feature is to provide for user acceptance of the final location of a roof structure. One optional way to do this is to provide an internet based interface for the customer/user. One example of such is shown in FIGS. 4A-4D. For example, in FIG. 4A, computer screen 100 provides a place to enter an address, such as field 102 for address entry (denoted by label 101). In the illustrated example, the street address "1710 Strand Ave, Tybee Island, Ga. 31328" may be entered in field 102 of the computer. The user may enter by clicking or otherwise button 103 to find that address. In response, computer screen 100 may appear like FIG. 4B. As such, it may depict imagery 502 of a region, the region including building 500 with its roof structure 501. Ordinarily, this includes not only the building structure 500, but also depicts adjacent buildings, trees, streets, and/or other features. Such imagery may come from a variety of places. One example could be Google® Earth imagery database which is web based and provides address location information. Such imagery covers much of the world, although it may or may not be comparatively low resolution imagery. In FIG. 4B, marker 106a is shown in the region 502, corresponding to the street address in field 102. Note further that while marker 106a is close to roof structure 501, it does not directly or perfectly correspond to roof structure 501. As such, the customer or other user may be allowed to move the marker (by click and dragging via computer mouse, arrows, or otherwise) to a final location 106b as depicted in FIG. 4C. Such final location is on top of the building 500 and such movement more precisely identifies the location of the building roof structure 501 to be measured. Optionally, in FIG. 4C when said marker has been moved to final location 106b, the user may activate a selection confirmation, such as confirm selection button 104, enter, checkbox or otherwise. Optionally, to potentially start over the user may be afforded the option of hitting the cancel button 105 or merely logging off. However, if confirmed selection button 104 or other such user acceptance is activated, another screen (and/or report) optionally may be provided, such as screen 100 as depicted in FIG. 4D. While this may be a wide variety in the formats, in the one example provided, some or all of the regional image 502a may be depicted showing the marker in its final location 106b. Also, a checkbox may be providing a further reconfirmation that the users reviewed the image is correct. In this way, the end user/customer will be sure that when placing an order, the vendor is measuring the correct roof structure as opposed to, for example, measuring the nearby roof structure due to mistake/miscommunication. Optionally, as shown in FIG. 4D, fields may depict the address to be measured 108, the city 109, the state 110, the postal code 111, and otherwise. Optionally, a drop down box 112 may be provided corresponding to the number of planes ordered. Additionally, other options, such as rush processing 113 or other special features may be provided. Also optionally, a reference number or other such job number field 114 or claim number field 115 and/or other fields may be available. Thus, for example, a roofer having a job number and/or bidding pursuant to an insurance claim number and/or an insurance company doing the same may optionally enter data therein. When they do so, optionally, such reference numbers and/or claim numbers may be reprinted or otherwise depicted on the deliverables to the client, such as report 550. This provides convenience to the end user/customer in that they may cross reference their deliverable report to their internal calendaring, docketing, invoicing, and/or job number system.

Also with reference to FIG. 4D, computer screen 100 and/or the reports may also depict latitude references and/or longitude references corresponding to the street address and/or more precisely to the final location 106*b* of the marker confirmed by the end user. Again, optionally, such latitude and longitude coordinates may be reflected in one or more of the reports.

Such translation to latitude and longitude coordinates also provides another optional feature. The present system and method may optionally include two or more separate imagery databases. For example, a lower resolution and/or less expensive image database such Google® Earth may be used as a first database, whereas a higher quality, higher resolution and/or more robust image database, such as by Pictometry International (as depicted here) may be used. Other vendors of imagery databases may be used and/or one may use their own image database(s). Thus, by translating the street address stated in longitude and latitude, it is easier to correlate to the second database. In this way, first imagery database from which the final location is selected may be internet based imagery having to corresponding street address look up field. Only further using the latitude and longitude coordinates to access imagery from a second imagery database, such as for example Pictometry's database. Thereafter, using the imagery from the second database can generate in computer memory outline drawings around outlines corresponding to roof planes based on tracing from imagery from said second imagery database. Such outline drawings may include drawings such as depicted in FIGS. 5D, 5E, 5F, 5G and/or FIGS. 6 and/or 7B-D for example. Additionally, since the first imagery database may merely be straight down, or plan views, whereas the second imagery may include a variety of oblique images, such as image 502 and 503 in FIG. 5A and/or oblique imagery 504 and 505 in FIG. 5B, as well as diagonal, top down imagery such as image 506 in FIG. 5C. This allows the optional, more complete image reporting to the client in report 550.

Such oblique imagery also permits the optional feature, as previously discussed, determining vertical measurements and/or roof pitches based on the imagery, as opposed to based on field measurements. Conversely, one can undertake this without any oblique imagery and/or any determination of vertical measurements or pitch, and instead rely on field measurements or other means for pitch.

Figure 3:
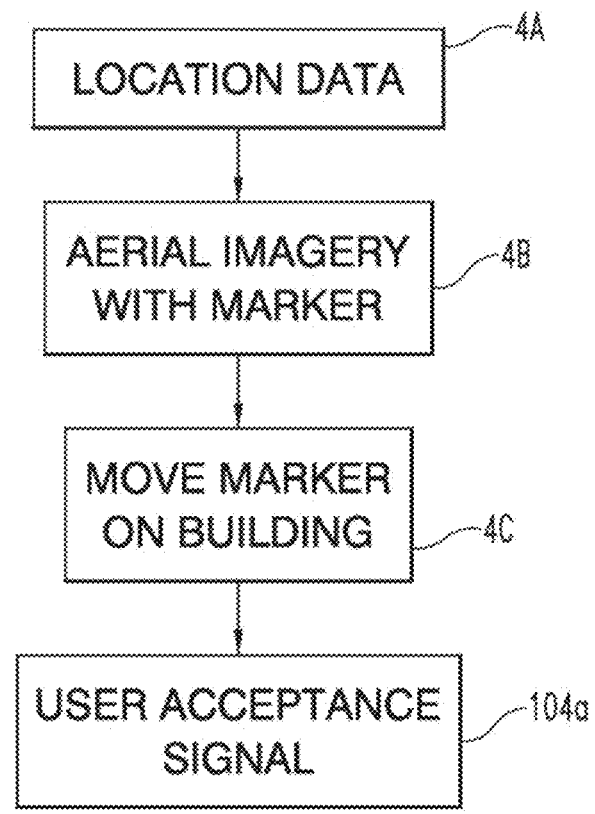
FIG. 3 is another example of a flow chart of acts according to the present invention.

In FIG. 3, the location data 4A is entered. Aerial imagery with a marker is provided 4B. A person moves the marker on the image of the building 4C. User acceptance of that marker position is then signaled 104*a*.

Figure 7A:
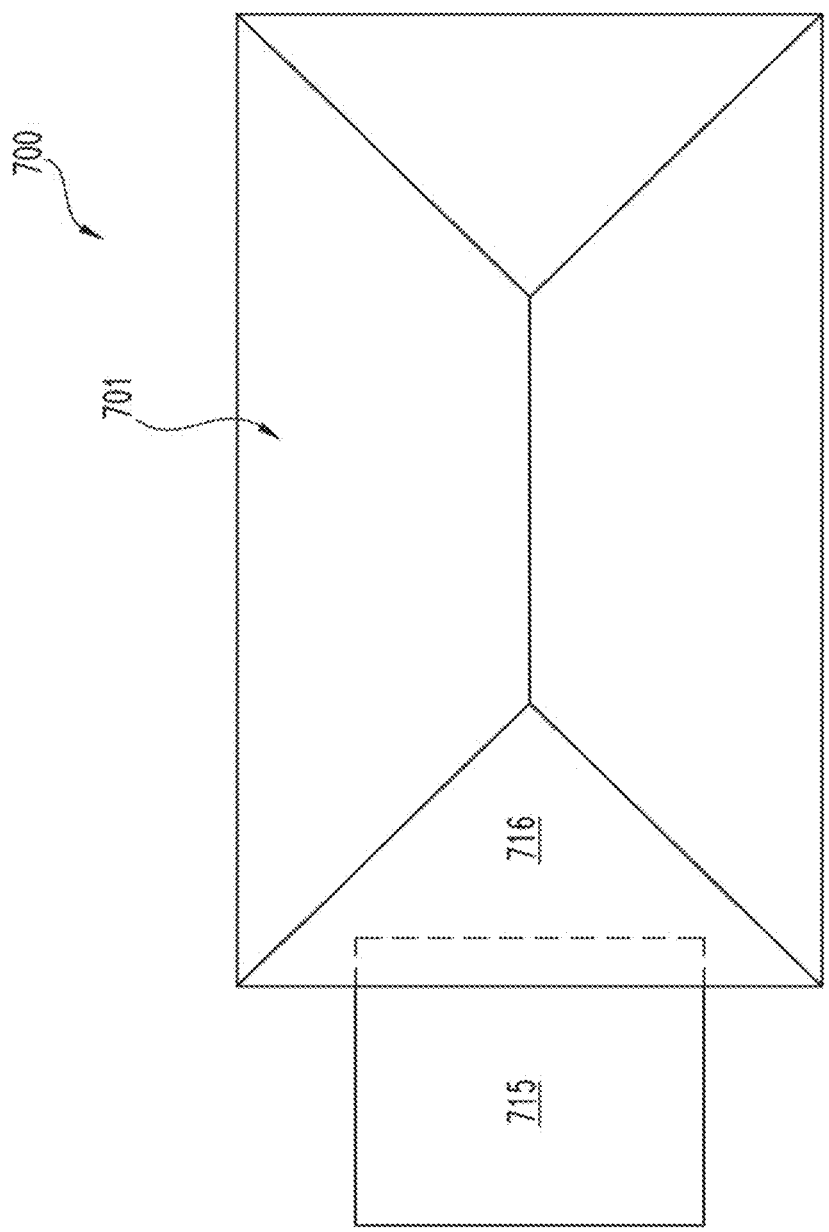
FIG. 7A is a top plan view of aerial imagery of a building roof structure.
Figure 7B:
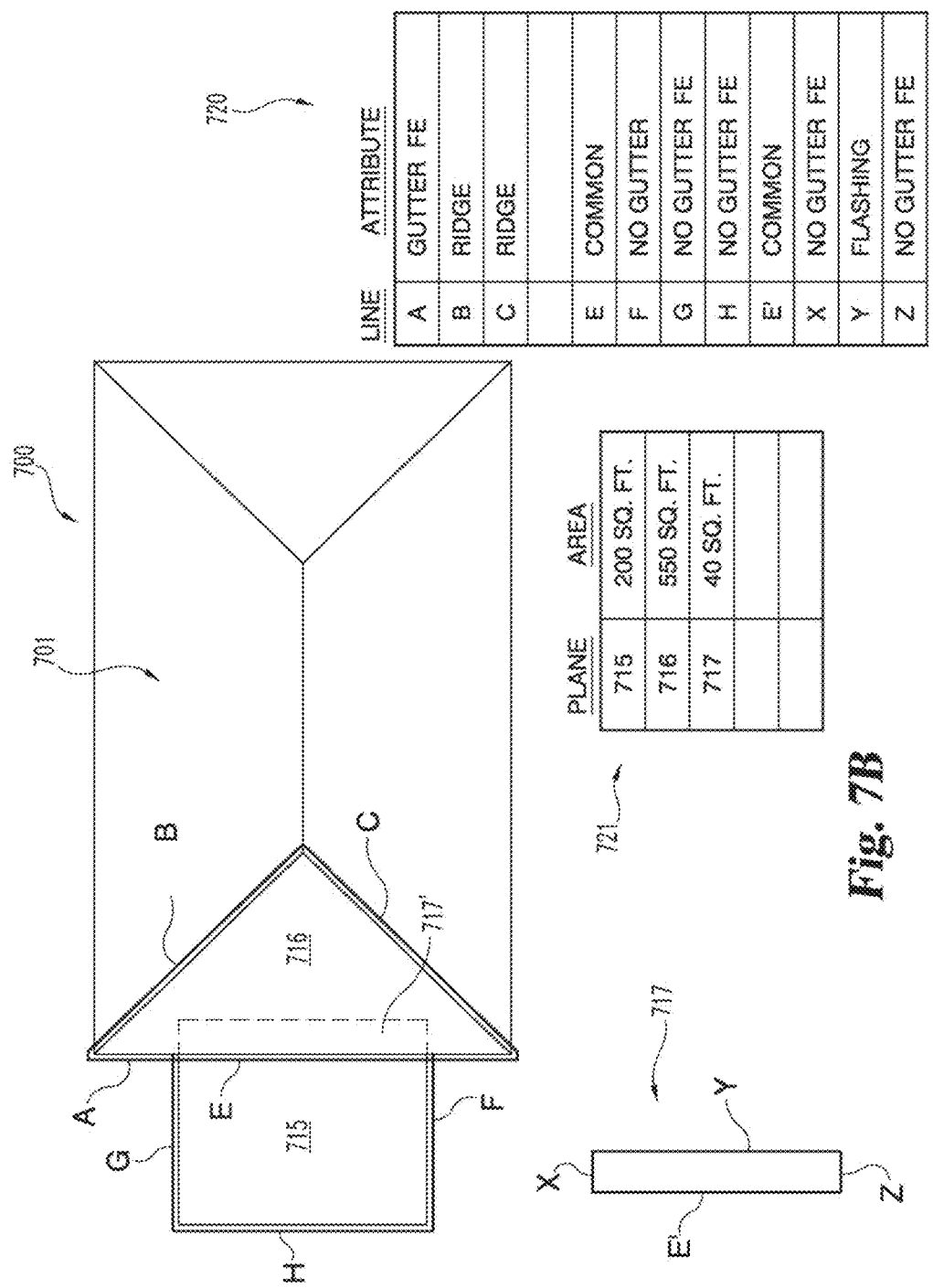
FIG. 7B is a display of the imagery of FIG. 7A with some optional features.

Mere examples of other optional features are depicted in FIGS. 7A and 7B. A simplified diagrammatic image of building 700 includes roof structure 701. While several roof planes are illustrated, the particular focus is directed to roof planes 715 and 716. As illustrated in FIG. 7B, a first electronic drawing (preferably in a first layer of the drawing) is made over the imagery comprising lines A, B and C. Moreover, a second electronic drawing (preferably, but not necessarily, in a second layer of the drawing) is made over to imagery comprising lines E, F, G and H. Note that in this illustrated example, at least a segment of line A is substantially overlapping with at least a segment of line E. Thus, for example, roof plane 715 outlined by E, F, G and H may comprise a flat roof (0 pitch) porch whereas the remainder of the roof structure 701 may comprise a hip roof over a rectangular house, the hip roof being depicted in a plan view with two triangles and two isosceles rhombuses, as shown.

Note further that FIG. 7B preferably is depiction of a deliverable, such as a report (and/or a screen shot), and optionally and more preferably is part of an interactive computer file. In this regard, it may include, optionally, table 720 and/or 721, as well as any of the other tables and/or fields and/or features previously depicted in the previous drawings. For example, table 721 includes at least columns with a line and a column for the attribute, which preferably in this context is the non-dimensional attribute. Note in the example of these substantially overlapping lines A and E, A has the attribute of being a gutter free edge, whereas E has the attribute label "common".

In this regard, the label "common" also corresponds to Line E' in connection with roof plane 717' illustrated in isolation as roof plane 717. Other terms may be used instead of "common", but this indication denotes two lines that are substantially overlapping and in which the main purpose of the line is merely for dissecting a common roof plane, normally for determining square feet area, as opposed to a non-dimensional attribute. This is because such "common" lines, in a sense, are imaginary between roof plane 715 and roof plane 717' and/or 717. Alternatively, in the context of this building the attribute of line E could be "flashing" (instead of line Y being flashing) based on the reasonable assumption that this flat planed porch roof abuts the side of the building and has roof flashing along line Y. However, in such situation by denoting line E as flashing, in lieu of line Y, since they are of common length, this is merely a substitute for the total linear estimate of flashing of the type illustrated, for example at 513 (FIG. 6) and/or table 521 (FIG. 5I).

Plane 716 illustrates a minimum number of three lines, A, B and C, to denote the area of plane 716. Conversely, note that plane 715 includes not only three lines, lines E, F and G, but also a fourth line, line H since it is rectilinear. This is consistent with the claiming of the present invention being open-ended in that at least three lines are required to define a roof plane, but it may be more. Likewise, a plane may be defined by 5, 6, 7 or more lines depending on its particular geometry.

As mentioned, it is not required, but is preferable that the lines defining the respective plane 715 and 716 are separate from each other, and even more preferable that they be in separate computer file layers overlaying one another. This helps facilitate having differing attributes along a common line as previously described in connection with the substantial overlap of lines A and E. Optionally, in the report the lines may be shown in different colors (and/or patterns) designated for each non-dimensional attribute.

Moreover, one or more additional adjustment planes, such as adjustment plane 717 prime, also depicted as free standing adjustment plane 717 may optionally be provided. This allows generating computer memory at least one adjustment roofing plane, such as by drawing lines E', X, Y and Z (as well as others). This is useful for a variety of situations, such as, for example, to adjust for portions of the roof structure which are not fully visible from the aerial imagery. This is shown in FIGS. 7A and 7B in that due to the overhanging eve of the hip roof of the house in plane 716, part of the porch's roof structure is hidden by the overhanging roof hang. This hidden portion is depicted by roof plane 717' and/or 717.

It should also be noted that optionally, this adjustment plane does not necessarily have to be graphically depicted, as shown in FIG. 7B. Rather, or in addition, an additional numeric field may be provided. For example, in FIG. 5F, the planes A-P are shown with their respective areas, and in some total of such areas. In this context, with or without a graphical depiction, an additional "plane" row may be provided denoted "adjustment" or otherwise with a numeric field allowing user entry of an area (square foot or otherwise) number be typed in or otherwise imported. Thus, the adjustment plane 717 (FIG. 7B) even if not graphically depicted, might have known dimensions of, for example, 20 feet wide, with a two foot pitch overhand, resulting in an additional 40 feet of area. In this situation, in the adjustment field the user might simply enter the value "40" in square footage terms for the adjustment field. This adjustment field will be added to the sum total, such as shown in the table of FIG. 5E. Note also that the adjustment value may be negative for a variety of reasons, given the user the ability to override and reduce the total estimation of square footage for reasons of discounting, or other circumstances.

Thus, for example, in FIG. 7B at table 721, it is denoted in that table as plane 717 with corresponding area of 40 square feet may correspond to a report that it is 20 feet wide (line E prime times 2 feet deep under the eaves, lines X and/or Z, thereby resulting in the calculation of 40 square feet. Or, as described above, alternatively with or without graphic depiction of plane 717, the user might simply enter the value "40" square feet in the area field of table 721.

Figure 7C:
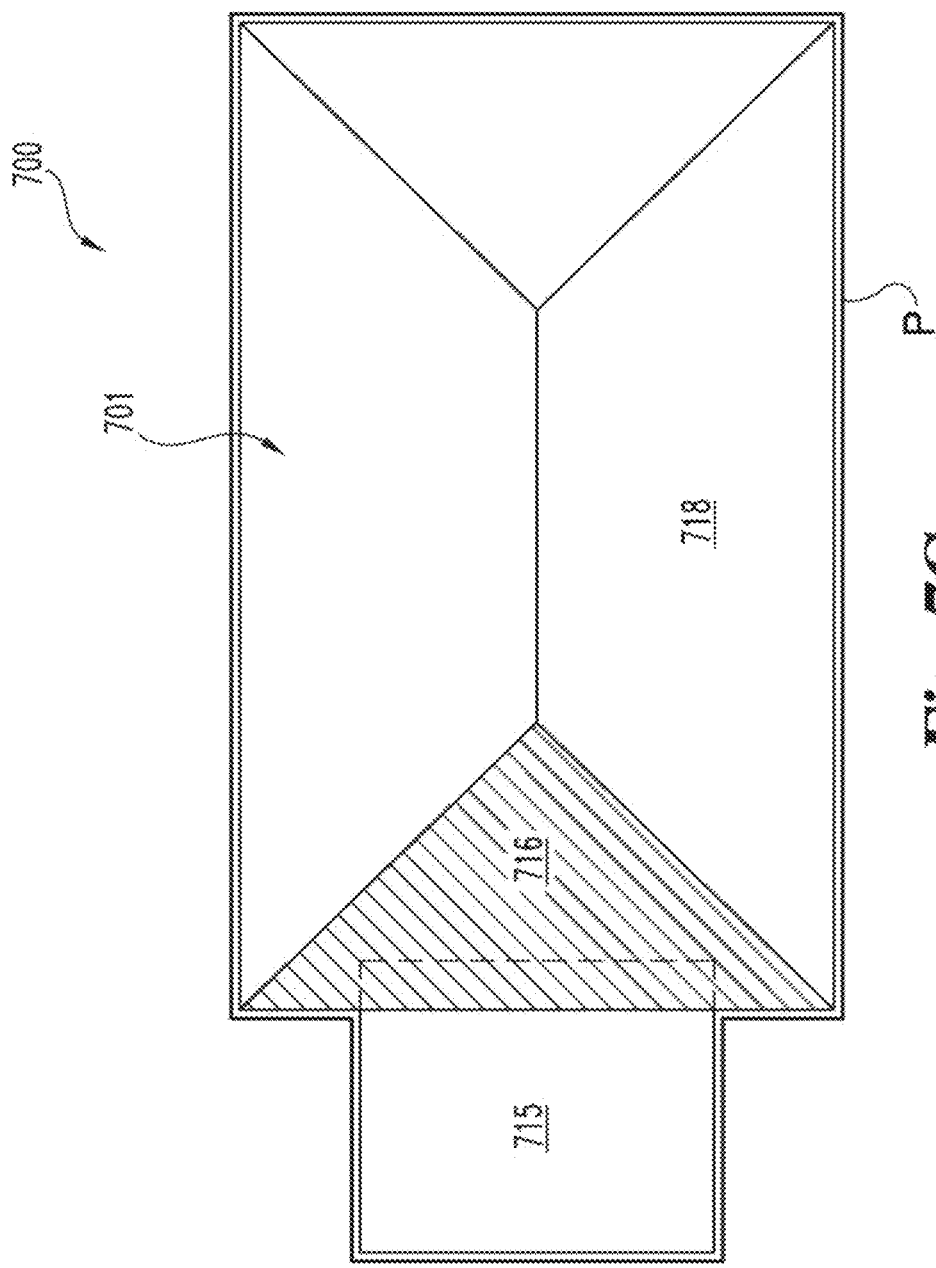
FIG. 7C depicts the imagery of FIG. 7A with shadowing.
Figure 7D:
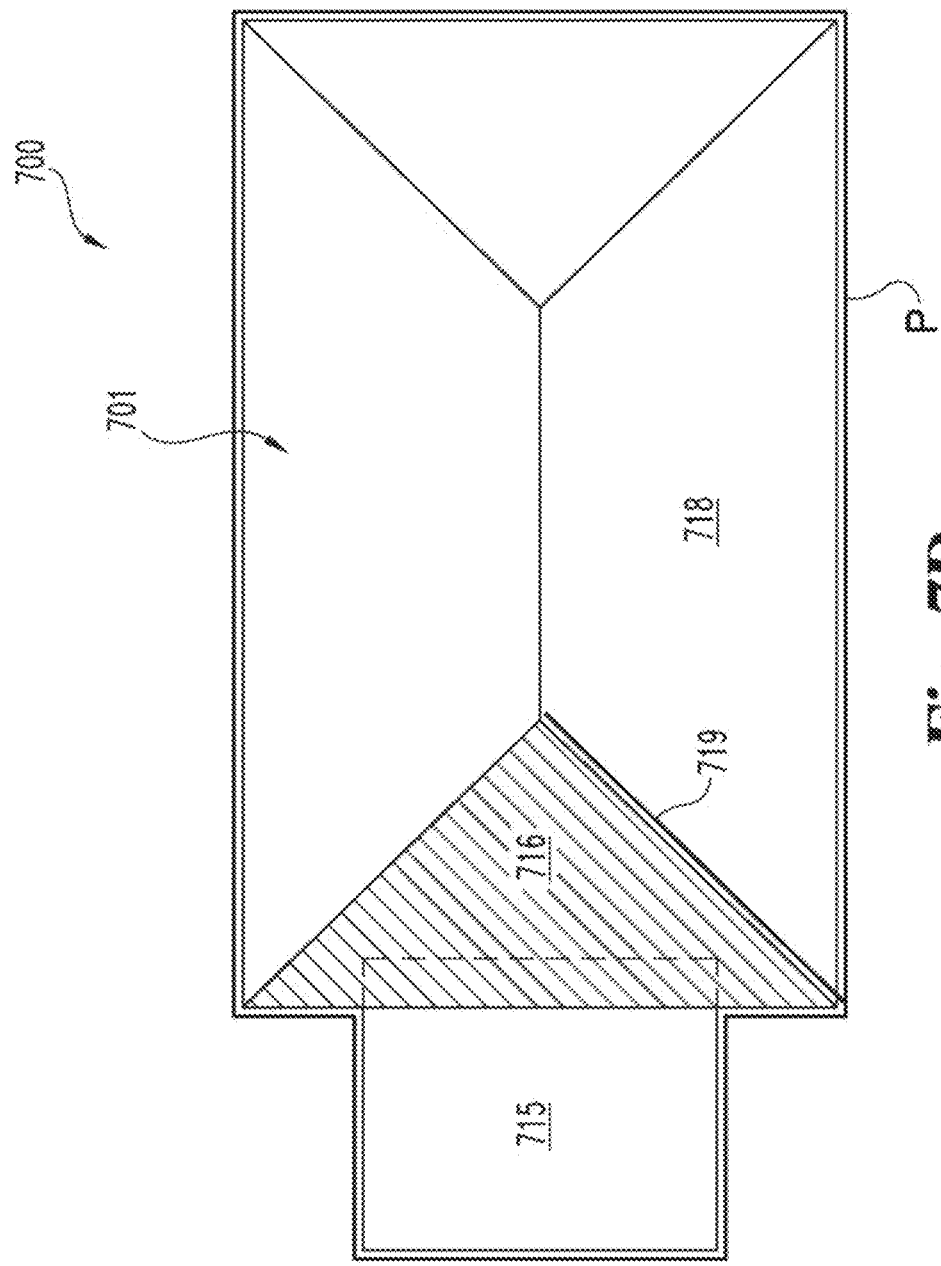
FIG. 7D depicts FIG. 7C with the addition of computer generated line.

FIGS. 7C and 7D, using the same structure of 7A and 7B, illustrates another feature which is optional, and may be used alone, or in connection with one or more of the features previously described. In particular, it provides for a computer data processing means that identifies light and dark contrast between adjacent roof planes, such as roof planes 716 and 718, and based on that automatically generates at least one border line, such as for example line 719 shown in FIG. 7D between such roof plane 716 and 718. In this regard, note that as illustrated in FIGS. 7C and 7D, roof plane 716 is shown as shaded. This represented in imagery of shadowing, typically caused by sun or other lighting casting different degrees of shadow in brightness and darkness depending on the orientation of the roof plane with the source of the light. The generation of various lines, such as line 719, is automatically computer generated. This may be done by a variety of techniques borrowed from the separate field of computer face recognition used in connection with digital images such as for security purposes. This may be done to create some or all of the line values, or more preferably at least starting point default lines drawing by the computer. However, optionally the default generation of the lines can be done after perimeter lines P, around the entire outer perimeter of the roof structure 701, having drawn ordinarily by a human user. This has the advantage of establishing a closed, finite area within the region for which the computer software automatically generates one or more of the lines separating the geometries of the separate roof planes. Preferably, this is done by generating and labeling discreet lines which may be overridden by the user, such as deleting extraneous or erroneous or duplicative lines and/or moving them. Moreover, optionally such lines may be generated as the subparts of geometric shapes set as presumptive default shapes common in roof planes. This normally would include rectangles, triangles and rhombuses.

Additionally, such automatic and/or default generation of lines may optionally be coupled with the previously described pitch generation algorithms. In this way, default pitches may be generated by the computer and depicted in the report output. Again, this can be overridden by the user, including the vendor of such report information.

Note also that in FIG. 7A-7D, the various lettered lines (A, B, C, E, F, G, H), are illustrated here slightly offset from the actual underlying line in the building imagery. In practice, preferably so as to maximize accuracy, there is not such offset. Rather, the offset is depicted here in FIG. 7A-D merely for drawing clarity to separately depict the line in the aerial image from the computer drawn line overlaying the image.

Another optional feature is that the information, including reporting, may be made to interface electronically (and/or manually) with other products. For example, the information provided here may be uploaded or transferred to Xactimate™ Insurance estimating software known in the prior art. Naturally, this feature, while helpful, is not required.

What is claimed:

1. A process, comprising:
    receiving first location data;
    providing visual access to a first image corresponding to the first location data, the first image including a roof structure of a building at a first resolution;
    providing a first computer input capable of signaling a designation from a user of a building roof structure location within the first image, wherein the building roof structure location is a geographic position of the building roof structure and is different than the first location data;
    receive a designation of the building roof structure within the first image;
    responsive to receiving the designation of the building roof structure location, providing a second computer input capable of signaling user-acceptance of the building roof structure location within the first image, wherein user-acceptance is one or more affirmative steps undertaken by the user to confirm the designation of the building roof structure location; and
    responsive to receiving the user-acceptance confirming the designation of the building roof structure location, providing visual access to one or more second image corresponding to geographic location coordinates of the building roof structure location, the one or more second image having a second resolution of the building image that is higher resolution than the first resolution.

2. The process of claim 1, further comprising providing visual access to one or more outline drawing corresponding to the roof structure of the building.

3. The process of claim 2, further comprising providing one or more length dimension on the outline drawing.

4. The process of claim 3, wherein the length dimension is one or more of a perimeter of the roof structure, a length of a ridge of the roof structure, a total length of ridges of the roof structure, a length of a valley of the roof structure, a total length of valleys of the roof structure, a length of a flashing of the roof structure, and a total length of flashings of the roof structure.

5. The process of claim 2, further comprising providing one or more area dimension on the outline drawing.

6. The process of claim 2, further comprising providing one or more pitch dimension on the outline drawing.

7. The process of claim 2, further comprising providing one or more indicator of pitch direction on the outline drawing.

8. The process of claim 2, further comprising providing one or more non-dimensional attribute of the roof structure on the outline drawing.

9. The process of claim 2, further comprising, providing visual access to a nadir image from an imagery database corresponding to location coordinates of the building roof structure location, and wherein the outline drawing is super-imposed on the nadir image.

10. The process of claim 1, wherein the first image is taken from an overhead view with respect to the roof structure of the building.

11. A non-transitory computer memory storing computer logic, that when executed by computer hardware causes the computer hardware to:
receive first location data generally corresponding to a geographic location of a building;
provide visual access to a first image corresponding to the first location data, the first image including a roof structure of the building at a first resolution;
provide a first computer input capable of signaling a designation from a user of a building roof structure location within the first image, wherein the building roof structure location is a geographic position of the building roof structure and is different than the first location data;
receive the designation of the building roof structure location;
responsive to receiving the designation of the building roof structure location, provide a second computer input capable of signaling user-acceptance of the building roof structure location within the first image, wherein user-acceptance is one or more affirmative steps undertaken by the user to confirm the designation of the building roof structure location; and
responsive to receiving the user-acceptance confirming the designation of the building roof structure location, provide visual access to one or more second image corresponding to geographic location coordinates of the building roof structure location, the one or more second image having a second resolution of the building that is higher resolution than the first resolution.

12. The non-transitory computer memory of claim 11, wherein said computer logic when executed by computer hardware causes the computer hardware to: provide visual access to one or more outline drawing corresponding to the roof structure of the building.

13. The non-transitory computer memory of claim 12, wherein said computer logic when executed by computer hardware causes the computer hardware to: provide at least one length dimension on the outline drawing.

14. The non-transitory computer memory of claim 12, wherein said computer logic when executed by computer hardware causes the computer hardware to: provide visual access to a nadir image of an imagery database corresponding to location coordinates of the building roof structure location, and wherein the outline drawing is super-imposed on the nadir image.

15. The non-transitory computer memory of claim 12, wherein said computer logic when executed by computer hardware causes the computer hardware to: provide one or more area dimension on the outline drawing.

16. The non-transitory computer memory of claim 11, wherein the first image is taken from an overhead view with respect to the roof of the building.

17. A method, comprising:
receiving, by a user, visual access to a first image of a region corresponding to first location data, the first image including a roof structure of a building at a first resolution;
signaling, by the user, a designation from the user of a building roof structure location within the first image, wherein the building roof structure location is a geographic position of the building roof structure and is different than the first location data;
signaling, by the user, user-acceptance of the building roof structure location within the first image, wherein user-acceptance is one or more affirmative steps undertaken by the user to confirm the designation of the building roof structure location; and
responsive to signaling the user-acceptance confirming the designation of the building roof structure location, receiving visual access to one or more second image corresponding to geographic location coordinates of the building roof structure location, the one or more second image having a second resolution of the building that is higher resolution than the first resolution; and
repairing or constructing a roof designated by the building roof structure location.

18. The method of claim 17, further comprising:
responsive to signaling the user-acceptance confirming the designation of the building roof structure location, receiving a roof report derived at least in part from the one or more second images.

19. The method of claim 18, wherein repairing or constructing the roof designated by the building roof structure location includes repairing or constructing the roof designated by the building roof structure location based at least in part on the roof report.

* * * * *